United States Patent
Nishida et al.

(10) Patent No.: US 7,310,754 B2
(45) Date of Patent: Dec. 18, 2007

(54) INTEGRATED TEST CIRCUIT, A TEST CIRCUIT, AND A TEST METHOD FOR PERFORMING TRANSMISSION AND RECEPTION PROCESSING TO AND FROM A FIRST AND A SECOND MACRO BLOCK AT A FIRST FREQUENCY

(75) Inventors: Haruo Nishida, Sapporo (JP); Takuya Ishida, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 624 days.

(21) Appl. No.: 10/766,038

(22) Filed: Jan. 29, 2004

(65) Prior Publication Data
US 2004/0268193 A1  Dec. 30, 2004

(30) Foreign Application Priority Data
Jan. 30, 2003  (JP) .............................. 2003-022274

(51) Int. Cl.
*G01R 31/28* (2006.01)
(52) U.S. Cl. ...................................... 714/724; 714/716
(58) Field of Classification Search ................ 714/726, 714/716, 724
See application file for complete search history.

(56) References Cited

U.S. PATENT DOCUMENTS 5,787,114 A * 7/1998 Ramamurthy et al. ...... 375/221
5,940,414 A * 8/1999 Takano et al. .............. 714/733
6,286,119 B1 * 9/2001 Wu et al. .................... 714/726
6,671,839 B1 * 12/2003 Cote et al. .................. 714/726

FOREIGN PATENT DOCUMENTS

JP   A 2002-343864   11/2002

OTHER PUBLICATIONS

U.S. Appl. No. 10/765,895, filed Jan. 29, 2004, Nishida et al.

* cited by examiner

*Primary Examiner*—James C. Kerveros
(74) *Attorney, Agent, or Firm*—Oliff & Berridge, PLC

(57) ABSTRACT

A macro block MB2 including a physical-layer circuit PHY for communications performs transmission and reception processing to and from a macro block MB1 at a clock frequency CF1. A test circuit TC includes a test transmission buffer TXB that stores a transmission data signal from a test input terminal TPI at a frequency CF2 that is lower than the frequency CF1, and a test reception buffer RXB that outputs a reception data signal to a test output terminal TPO at a frequency CF3 that is lower than the frequency CF1. After the transmission buffer TXB has stored the transmission data signal from the terminal TPI at the frequency CF2, it outputs the stored transmission data signal to the MB2 at the frequency CF1. After the reception buffer RXB has stored the reception data signal from the MB2 at the frequency CF1, it outputs the stored reception data signal to the terminal TPO at the frequency CF3.

9 Claims, 20 Drawing Sheets

FIG. 7A  FIRST TEST MODE
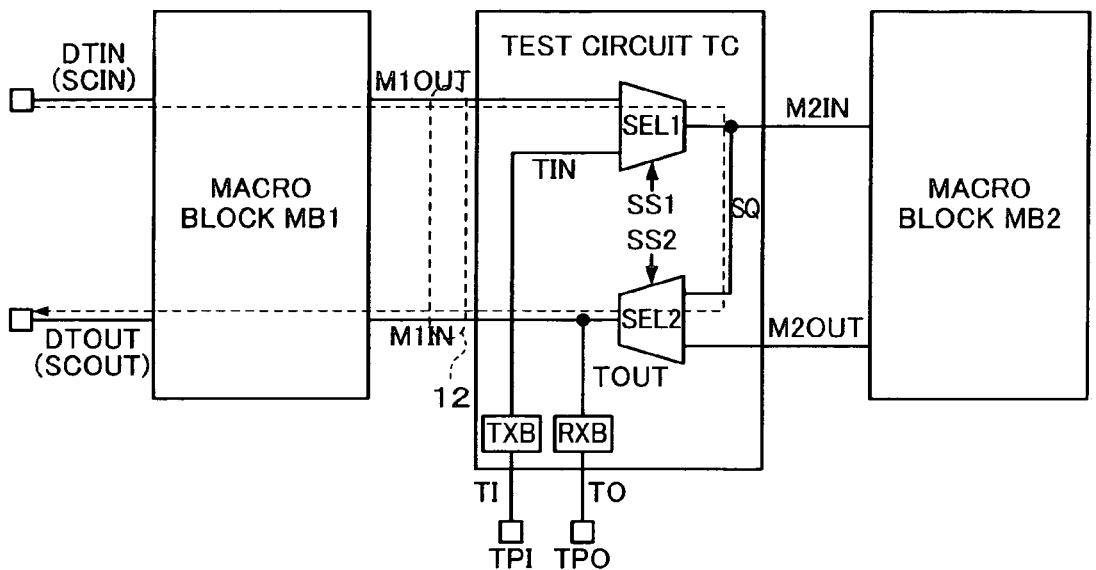
FIG. 7B  SECOND TEST MODE
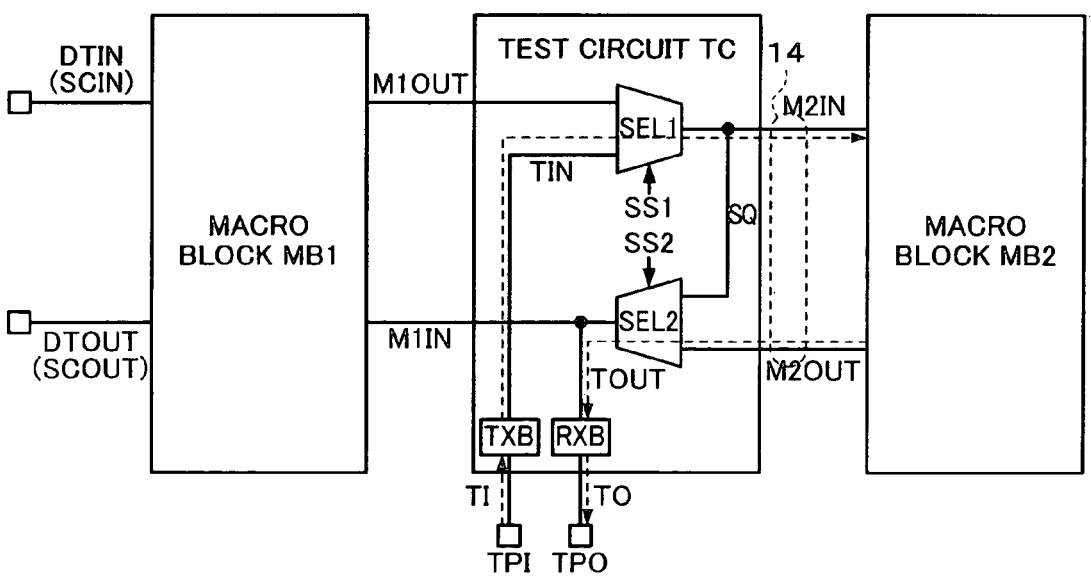

SCAN PATH SETTING

FIG. 14

| TAD | TRD/TWR | Bit3 | Bit2 | Bit1 | Bit0 |
|---|---|---|---|---|---|
| 0x0 | W | TxBuf0[7] | TxBuf0[6] | TxBuf0[5] | TxBuf0[4] |
| 0x0 | R | RxBuf0[7] | RxBuf0[6] | RxBuf0[5] | RxBuf0[4] |
| 0x1 | W | TxBuf0[3] | TxBuf0[2] | TxBuf0[1] | TxBuf0[0] |
| 0x1 | R | RxBuf0[3] | RxBuf0[2] | RxBuf0[1] | RxBuf0[0] |
| 0x2 | W | TxBuf1[7] | TxBuf1[6] | TxBuf1[5] | TxBuf1[4] |
| 0x2 | R | RxBuf1[7] | RxBuf1[6] | RxBuf1[5] | RxBuf1[4] |
| 0x3 | W | TxBuf1[3] | TxBuf1[2] | TxBuf1[1] | TxBuf1[0] |
| 0x3 | R | RxBuf1[3] | RxBuf1[2] | RxBuf1[1] | RxBuf1[0] |
| 0x4 | W | TxBuf2[7] | TxBuf2[6] | TxBuf2[5] | TxBuf2[4] |
| 0x4 | R | RxBuf2[7] | RxBuf2[6] | RxBuf2[5] | RxBuf2[4] |
| 0x5 | W | TxBuf2[3] | TxBuf2[2] | TxBuf2[1] | TxBuf2[0] |
| 0x5 | R | RxBuf2[3] | RxBuf2[2] | RxBuf2[1] | RxBuf2[0] |
| 0x6 | W | TxBuf3[7] | TxBuf3[6] | TxBuf3[5] | TxBuf3[4] |
| 0x6 | R | RxBuf3[7] | RxBuf3[6] | RxBuf3[5] | RxBuf3[4] |
| 0x7 | W | TxBuf3[3] | TxBuf3[2] | TxBuf3[1] | TxBuf3[0] |
| 0x7 | R | RxBuf3[3] | RxBuf3[2] | RxBuf3[1] | RxBuf3[0] |
| 0x8 | R/W | - | - | TXMODE | - |
| 0x9 | R/W | XCVRSELECT | TERMSELECT | OPMODE1 | OPMODE0 |
| 0xA | R/W | PLLSELECT | OSCENB | CLKSELECT1 | CLKSELECT0 |
| 0xB | R/W | RESET | RAWCLOCK | ANA_IQ | SUSPEND |
| 0xC | R/W | OPENLOOP | TgICLK | DivideCLK | MonCLK(R) |
| 0xD | R | MonRXACTIVE | MonRXERROR | MonLINESTATE1 | MonLINESTATE0 |
| 0xE | R/W | - | - | MonRXERROR(R) | LatRXERROR |
| 0xF | R/W | - | - | - | TXSTART |

INTEGRATED TEST CIRCUIT, A TEST CIRCUIT, AND A TEST METHOD FOR PERFORMING TRANSMISSION AND RECEPTION PROCESSING TO AND FROM A FIRST AND A SECOND MACRO BLOCK AT A FIRST FREQUENCY

Japanese Patent Application No. 2003-22274, filed on Jan. 30, 2003, is hereby incorporated by reference in its entirety.

BACKGROUND OF THE INVENTION

The present invention relates to a test circuit, an integrated circuit, and a test method.

Attention has recently been focused on the proposal of the universal serial bus (USB) 2.0 standard which can implement data transfer at speeds far greater than the prior-art USB 1.1 standard, while maintaining backward compatibility with USB 1.1. The USB 2.0 transceiver macrocell interface (UTMI), which has defined interface specifications for parts of the physical-layer and logical-layer circuits under USB 2.0, has also been proposed. A prior-art technique of using macro blocks (macro cells) conforming to UTMI in an integrated circuit is disclosed in Japanese Patent Laid-Open No. 2002-343864, by way of example.

In addition to the full-speed (FS) mode defined by the prior-art USB 1.1, USB 2.0 provides a transfer mode called high-speed (HS) mode. Since data transfer in this HS mode is at 480 Mbps, it is possible to implement data transfer at a much higher speed than the data transfer at 12 Mbps of FS mode.

With such a UTMI macro block that is capable of high-speed data transfer, however, there is a technical problem in that it is difficult to test to detect faults. In other words, transmission and reception processing occurs between the UTMI macro block and a serial interface engine (SIE) in the previous stage, over an 8-bit bus at a 60-MHz clock frequency (a first clock frequency), by way of example. To detect faults (such as wiring defects and element defects) in the UTMI macro block, therefore, it is necessary for an external tester to write a transmission data signal at the 60-MHz clock frequency and read a reception data signal at the 60-MHz clock frequency, from a test terminal (pin). However, the test terminal has a large parasitic capacitance so that there are large signal delays in the I/O cell of the test terminal. This means that attempts to perform tests at a high-speed clock frequency of 60 MHz result in large mismatches between the test results and expected values, leading to fears that it would be impossible to implement stable testing.

A UTMI macro block causes particular concern in that it creates a special situation because the internal analog circuit and high-speed digital circuit cannot operate in HS mode without being set to a clock frequency of 480 MHz (60 MHz). Without testing at 480 MHz (60 MHz), it is impossible to guarantee high-speed operation in HS mode and thus there is a danger that reliability will deteriorate.

BRIEF SUMMARY OF THE INVENTION

According to one aspect of the present invention, there is provided a test circuit for a second macro block that performs transmission and reception processing to and from a first macro block at a first clock frequency, the test circuit comprising:

a test transmission buffer which stores a transmission data signal from a test input terminal at a second clock frequency that is lower than the first clock frequency; and a test reception buffer which outputs a reception data signal from the second macro block to a test output terminal at a third clock frequency that is lower than the first clock frequency, wherein, after storing the transmission data signal from the test input terminal at the second clock frequency, the test transmission buffer outputs the stored transmission data signal to the second macro block at the first clock frequency, the second macro block including a physical-layer circuit for data communications, and wherein, after storing the reception data signal from the second macro block at the first clock frequency, the test reception buffer outputs the stored reception data signal to the test output terminal at the third clock frequency.

According to another aspect of the present invention, there is provided a test method for testing for a second macro block which performs transmission and reception processing to and from a first macro block at a first clock frequency, using a test circuit including a test transmission buffer and a test reception buffer, the test method comprising:

storing a transmission data signal from a test input terminal into the test transmission buffer at a second clock frequency that is lower than the first clock frequency and, after the transmission data signal has been stored, outputting the stored transmission data signal to the second macro block at the first clock frequency, the second macro block including a physical-layer circuit for data communications; and storing a reception data signal from the second macro block into the test reception buffer at the first clock frequency and, after the reception data signal has been stored, outputting the stored reception data signal to the test output terminal at a third clock frequency that is lower than the first clock frequency.

BRIEF DESCRIPTION OF THE SEVERAL VIEWS OF THE DRAWING

FIGS. 7A and 7B are illustrative of the operation of the test circuit of FIG. 6;

FIG. 14 shows an example of a buffer address map;

DETAILED DESCRIPTION OF THE EMBODIMENT

Embodiments are described below. Note that the embodiments described below do not limit the scope of the invention defined by the claims laid out herein. Similarly, the overall configuration of the embodiments below should not be taken as limiting the subject matter defined by the claims herein.

1. Transmission and Reception Test of Macro Block

Figure 1A:
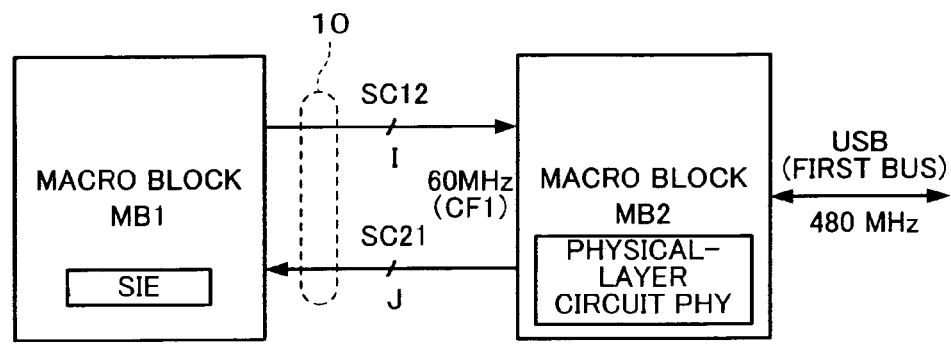
FIGS. 1A and 1B are illustrative of a method of testing an integrated circuit that comprises macro blocks.

An example of an integrated circuit formed by connecting together a plurality of macro blocks MB1 and MB2 (macro cells or circuit blocks) is shown in FIG. 1A. In this case, MB2 is a macro block comprising a physical-layer circuit PHY for data communications, such as a macro block that conforms to a standard such as the USB 2.0 transceiver macrocell interface (UTMI). MB1 is a macro block comprising a serial interface engine (SIE) circuit for controlling MB2.

Figure 1B:
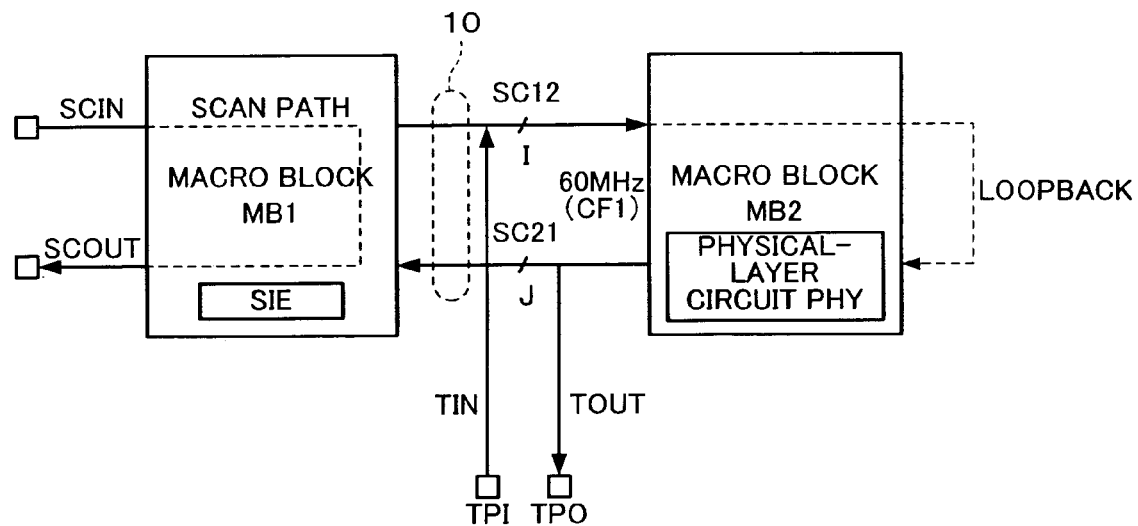

To detect faults in an integrated circuit such as that shown in FIG. 1A, it is possible to use a known scan method to set a scan path to MB1, for fault detection within the macro block MB1 as shown by way of example in FIG. 1B.

To detect faults within the macro block MB2, it is possible to input test input signals TIN from test input terminals (pins) TPI and output test output signals TOUT that are the results of those tests from test output terminals TPO, by way of example. More specifically, the transmission and reception processing of the macro block MB2 over USB (generally speaking: a first bus) is set to loopback mode so that a transmission data signal that has been sent over USB is received back by MB2 as a reception data signal. When an external tester inputs a transmission data signal TIN from the test input terminals TPI, the transmission data signal that has been input to the macro block MB2 is transmitted over USB. When the macro block MB1 that has been set to loopback mode receives this transmission data signal over USB as a reception data signal, that reception data signal is output to the macro block MB1 side and is read by the tester through the test output terminals TPO. The tester then determines whether or not the read reception data signal matches an expected value.

The macro block MB2 performs data transmission and reception processing over USB at a clock frequency of 480 MHz, by way of example. For that reason, the transmission and reception processing between the macro block MB2 and the macro block MB1 comprising the SIE is done at the 60-MHz clock frequency (a first clock frequency CF1), by way of example. When inputting the transmission data signal TIN from the test input terminals TPI, therefore, it is necessary to input it at the 60-MHz clock frequency (CF1). Similarly, it is necessary to output at the 60-MHz clock frequency when outputting the reception data signal TOUT from the test output terminals TPO.

However, there are usually large parasitic capacitances in the test terminals TPI and TPO. This means that there are large signal delays in the I/O cells of the test terminals, and also wide variations in these signal delays due to variations in the integrated circuit fabrication process and temperature. When the signals TIN are input through the terminals TPI and the signals TOUT are output through the terminals TPO at the high-speed clock frequency of 60 MHz, there will be mismatches between the test results and the expected values caused by signal delays. This causes a technical problem in that it is not possible to obtain stable test results.

In addition, testing by the method shown in FIG. 1B raises a technical problem in that it is difficult to detect faults in a connecting portion 10 (the wiring for I signals SC12 and J signals SC21). In other words, it is difficult to create a test pattern that can achieve a fault detection rate of at least 90 percent in the connecting portion 10 (the signals SC12 and SC21), even if the scan path to the macro block MB1 is tested. For that reason, the development of a test pattern tends to be time-consuming and expensive.

Since the method of FIG. 1B necessitates the provision of (I+J) test terminals TPI and TPO, the number of terminals increases, leading to a technical problem in that the cost of the integrated circuit increases. It is desirable to implement a test circuit that can solve the above-described problems.

2. Test Circuit

Figure 2:
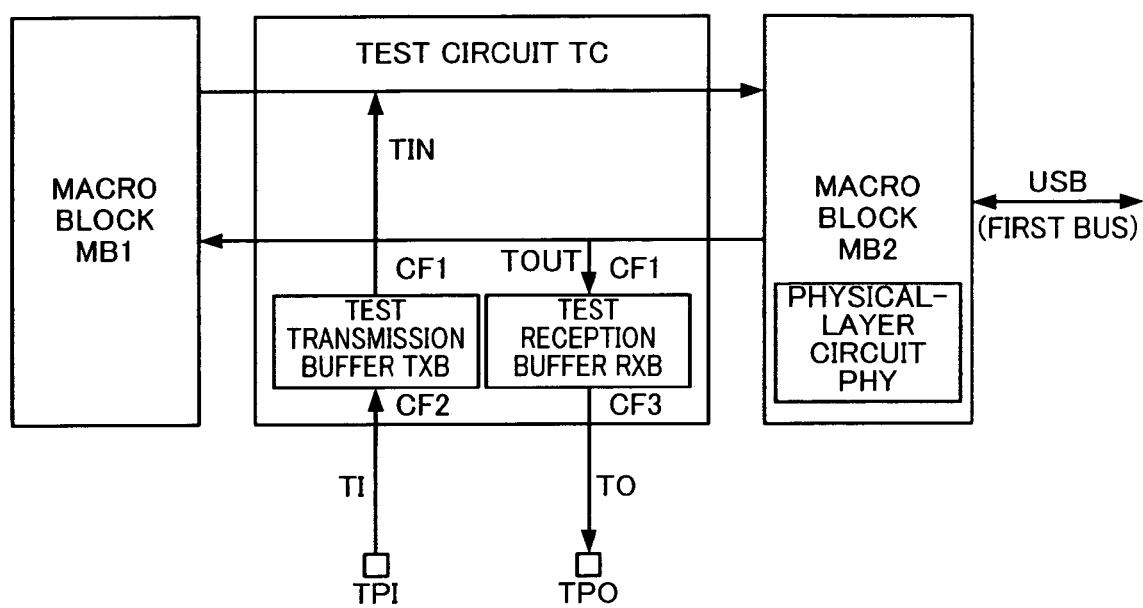
FIG. 2 shows an example of the configuration of the test circuit of this embodiment.

An example of the configuration of a test circuit TC in accordance with this embodiment, and an integrated circuit comprising the same, is shown in FIG. 2. Note that the number of macro blocks in FIG. 2 is two, but the integrated circuit of this embodiment could also comprise three or more macro blocks.

The macro blocks (circuit blocks) MB1 and MB2 shown in FIG. 2 are circuit blocks having circuits that have one or more functions (such as a communications circuit, a circuit for controlling such a communications circuit, a circuit for interfacing with a bus, RAM, a CPU, a DSP, a liquid-crystal driver, a CCD controller, or a user-customized circuit).

More specifically, MB2 could be a macro block for communications which comprises a physical-layer circuit for communications, by way of example; even more specifically, it could be a macro block that conforms to the UTMI specifications (a specific interface standard). MB1 could be a macro block comprising a circuit (SIE) for controlling MB2, a buffer, an interface circuit, or a user-customized circuit, by way of example. In other words, MB1 is a macro block configured by a logic circuit and MB2 is a macro block that comprises an analog circuit such as a physical-layer circuit PHY for communications. MB2 is a macro block that performs transmission and reception processing for transmission and reception data signals to and from the macro block MB1, at the clock frequency CF1 (the CF1 clock signal).

The test circuit TC comprises a test transmission buffer TXB. This TXB is a buffer that stores a transmission data signal TI (the test input signals) from the test input terminals TPI at a frequency CF2 (a second clock frequency) that is lower than CF1 (the first clock frequency). More specifically, TXB stores the signal TI from TPI in synchronization with a clock signal of the frequency CF2.

The test circuit TC comprises a test reception buffer RXB. This RXB is a buffer for outputting a reception data signal TO (the test output signals) to the test output terminals TPO at a frequency CF3 (a third clock frequency) that is lower than the frequency CF1. More specifically, RXB is a buffer that outputs the signal TO to TPO in synchronization with a clock signal of the frequency CF3.

Figure 3A:
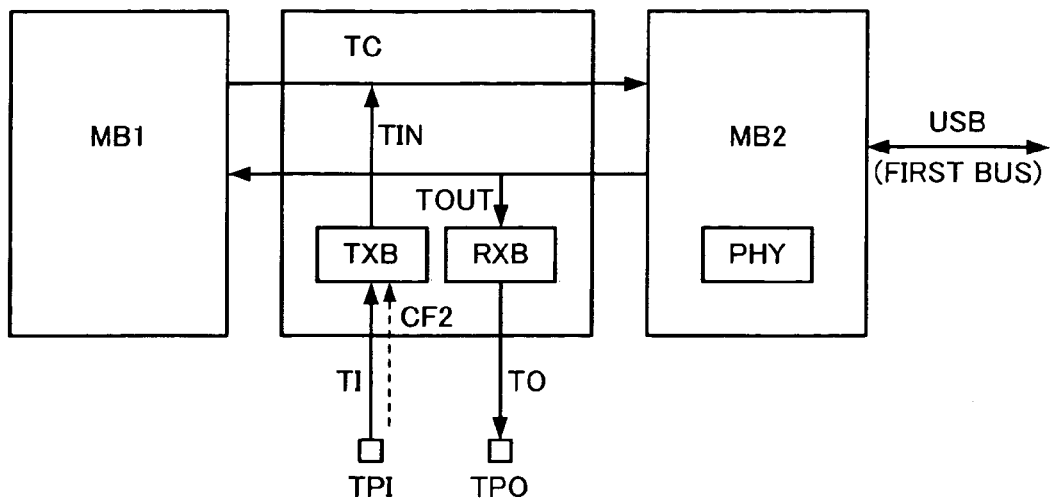
FIGS. 3A, 3B, and 3C are illustrative of the operation of the test circuit of FIG. 2.
Figure 3B:
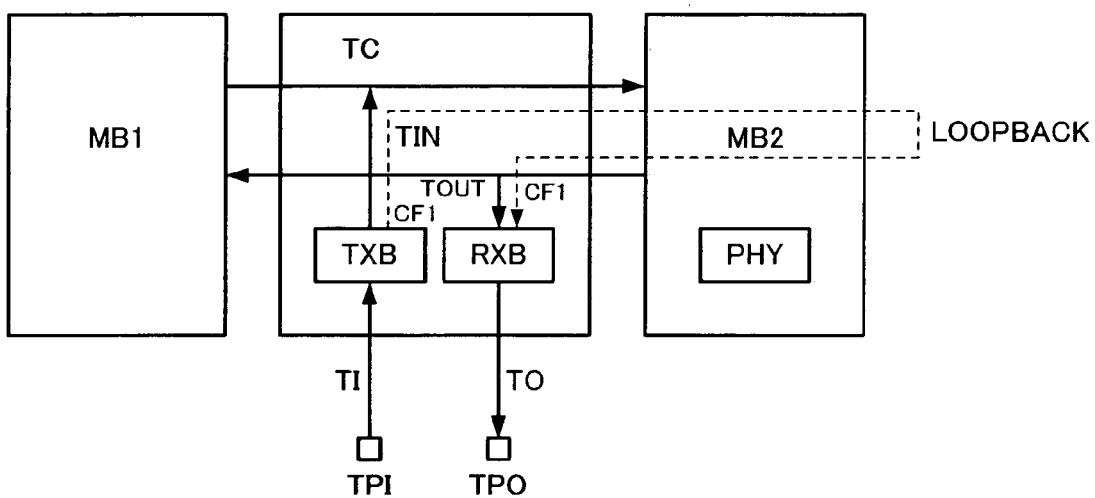

In this embodiment, the test transmission buffer TXB stores the transmission data signal TI from the test input terminals TPI at the lower clock frequency CF2 (stores it in synchronization with the CF2 clock signal), as shown in FIG. 3A. In other words, the external tester writes the transmission data signal through the terminals TPI to TXB at the frequency CF2. After the storing is complete (after a predetermined number of bytes of data have been stored), the stored transmission data signal TIN is output to the macro block MB2 at the frequency CF1 that is higher than CF2 (output in synchronization with the CF1 clock signal), as shown in FIG. 3B. When that happens, the macro block MB2 accepts the transmission data signal TIN at the frequency CF1.

The macro block MB2 subsequently outputs the reception data signal TOUT to the test circuit TC at the higher frequency CF1. More specifically, the macro block MB2 that has received the transmission data signal TIN performs transmission and reception processing in loopback mode over USB (generally speaking: a first bus), and outputs the reception data signal that was received in loopback mode to the macro block MB1 side (the test circuit TC side) at the frequency CF1.

Figure 3C:
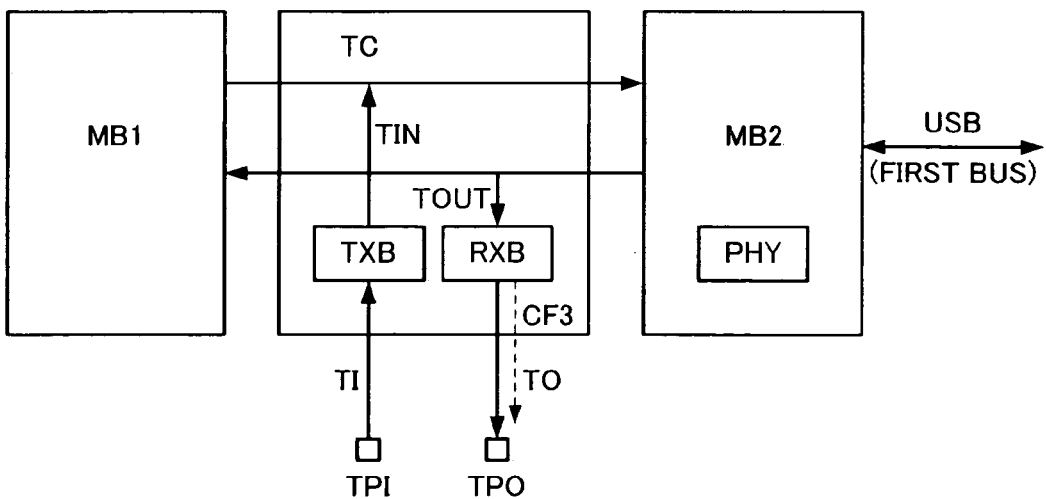

When that happens, the test reception buffer RXB stores the reception data signal TOUT from the macro block MB2 at the higher clock frequency CF1 (stores it in synchronization with the CF1 clock signal), as shown in FIG. 3C. After the storing is complete, RXB outputs the stored reception data signal TO to the test output terminals TPO at the lower clock frequency CF3 (outputs it in synchronization with the CF3 clock signal). In other words, the external tester reads the reception data signal from RXB through the terminals TPO at the frequency CF3. It then compares the read reception data signal with an expected value, and determines the result of the test. Note that CF2 and CF3 could be the same frequency or they could be different frequencies.

In this embodiment as described above, after reception data has accumulated at the lower frequency CF2 in the transmission buffer TXB, the accumulated reception data is read out from TXB at the higher frequency CF1. Conversely, after reception data from MB2 has accumulated in the reception buffer RXB at the higher frequency CF1, the accumulated reception data is read out from RXB at the lower frequency CF3.

The process of writing to the transmission buffer TXB through the terminals TPI and the processing of reading from the reception buffer RXB through the terminals TPO can therefore be done at the lower frequencies CF2 and CF3. Thus the tester is able to maintain some leeway in the processing of writing and reading signals. As a result, it is possible to perform the comparison between the test result and the expected value without problems, even if there are signal delays in the I/O cells of the terminals TPI and TPO, enabling the implementation of stable test operation.

With the macro block MB2 conforming to UTMI, there is a problem in that the analog and high-speed logic circuits comprised therein can only operate at a frequency of 480 MHz (60 MHz) in high-speed mode. If the macro block MB2 is not tested when operating at 480 MHz, there is a danger that it will be impossible to reliably guarantee high-speed operation in USB 2.0 HS mode.

This embodiment makes it possible to output the transmission data signal from the transmission buffer TXB and store the reception data signal in the reception buffer RXB at the higher frequency CF1 (60 MHz). It is therefore possible to enable the macro block MB2 to operate at higher frequencies (480 MHz for the analog and high-speed logic circuits and 60 MHz for the interface circuit). As a result, it is possible to test while the macro block MB2 is operating suitably, and also improve the reliability of the testing.

Figure 4:
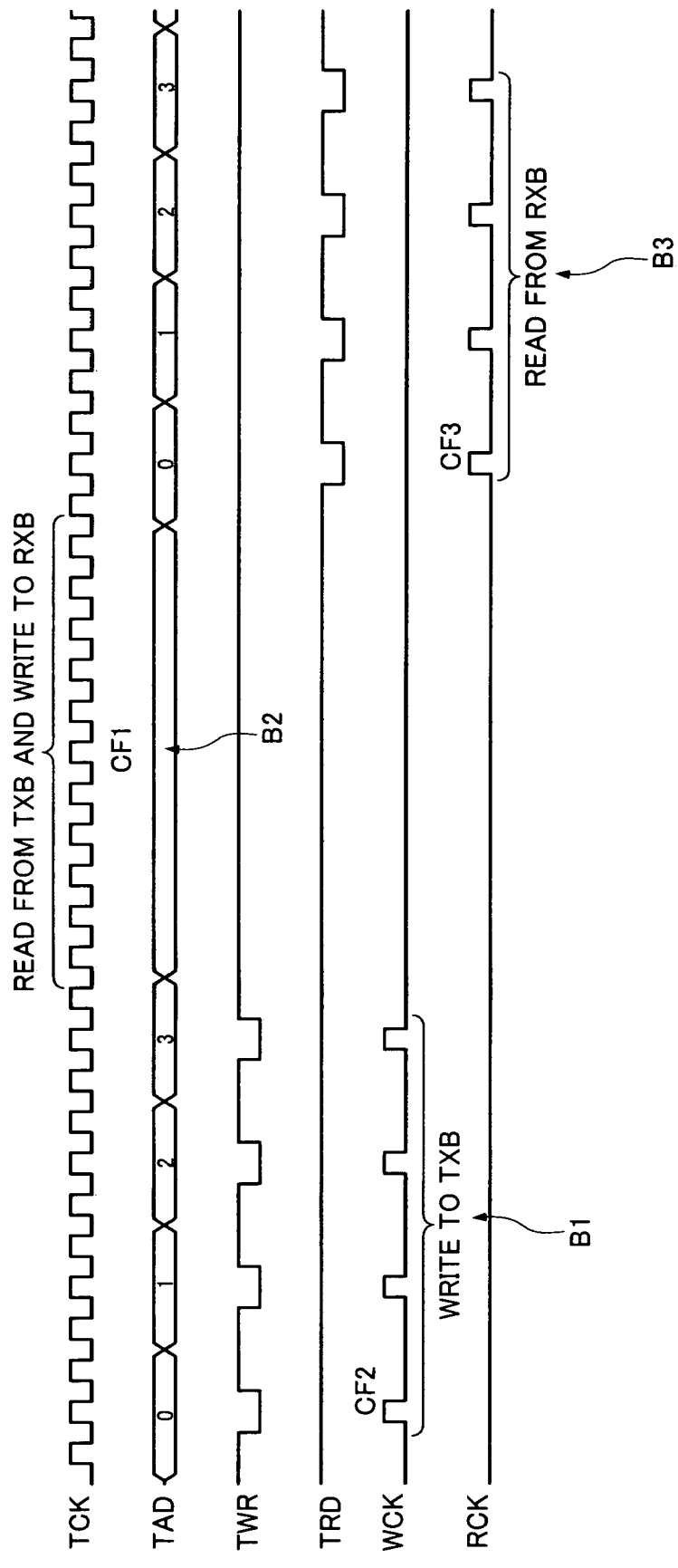
FIG. 4 is a waveform chart illustrating the operation of the test circuit.

A waveform chart illustrating the operation of the test circuit TC of FIG. 2 is shown in FIG. 4. TCK denotes a clock signal of the tester and TAD denotes an address signal for specifying addresses in the transmission buffer TXB and the reception buffer RXB. TWR denotes a write signal for TXB and TRD denotes a read signal for RXB. WCK denotes a clock signal for writing the transmission data signal to TXB, where this WCK could be created from TCK and TWR, by way of example. RCK denotes a clock signal for reading the reception data signal from RXB, where this RCK could be created from TCK and TRD, by way of example.

As shown at B1 in FIG. 4, the process of writing to the transmission buffer TXB, as described with reference to FIG. 3A, is done by the clock signal WCK of the lower frequency CF2.

As shown at B2 in FIG. 4, the process of reading the transmission data signal from the transmission buffer TXB and writing the reception data signal to the reception buffer RXB (transmission and reception processing of MB2), as described with reference to FIG. 3B, is done by the clock signal TCK of the higher frequency CF1.

As shown at B3 in FIG. 4, the process of reading the reception data signal from the reception buffer RXB, as described with reference to FIG. 3C, is done by the clock signal RCK of the lower frequency CF3.

3. Communications Sequencer

Figure 5:
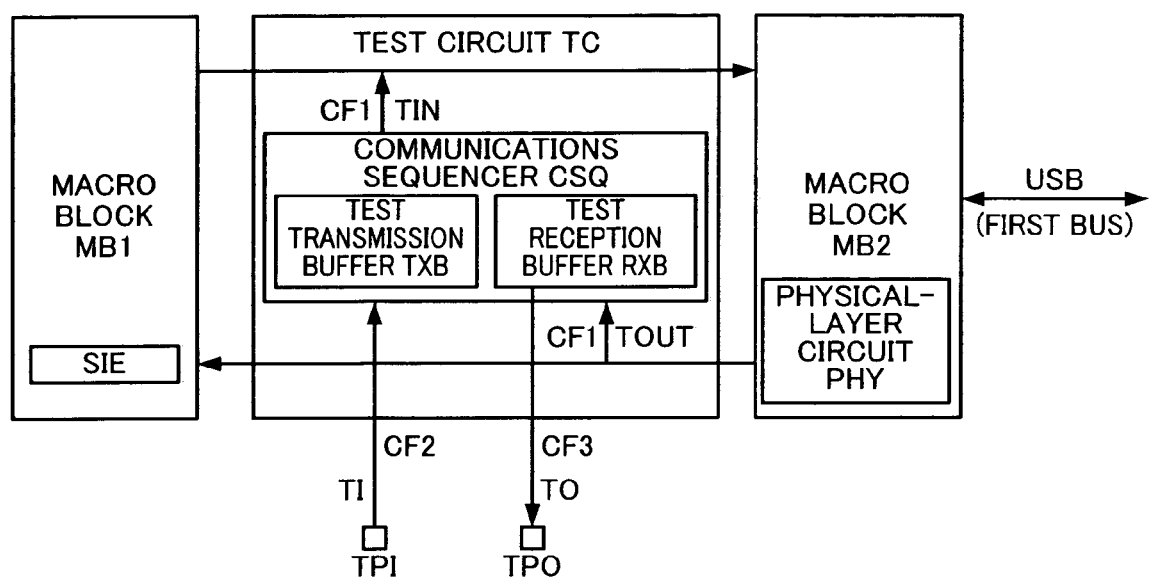
FIG. 5 shows an example of the configuration of the test circuit that comprises a communications sequencer CSQ.

With this embodiment, the communications sequencer CSQ could be comprised within the test circuit TC, as shown in FIG. 5.

In this case, the communications sequencer CSQ performs transmission and reception processing to and from the macro block MB2 by a predetermined communications protocol (a communications protocol conforming to a communications macro block specification such as UTMI). When the transmission data signal is stored from the terminals TPI into the transmission buffer TXB at the frequency CF2, the communications sequencer CSQ automatically transmits the transmission data signal that has been stored in the transmission buffer TXB to the macro block MB2, after that storage is complete.

CSQ subsequently receives the reception data signal from MB2 automatically, at the frequency CF1, and stores it in the reception buffer RXB. After the storage of the reception data signal in the reception buffer RXB is complete, the stored reception data signal is read out at the frequency CF3 and is output to the terminals TPO.

The use of this communications sequencer CSQ enables the automatic performance of the processing for reading and transmitting the transmission data signal from the transmission buffer TXB and the processing for receiving the reception data signal from the macro block MB2 and writing it to the reception buffer RXB, making the testing more efficient.

4. Detection of Faults in Connecting Portions

An example of the configuration of the test circuit TC that enables an improvement in the detection of faults in the connecting portion 10 between MB1 and MB2 is shown in FIG. 1.

This test circuit TC comprises a selector SEL1 (a first selector). In this case, SEL1 has a first input to which output signals M1OUT from MB1 (the first macro block) are input. The test input signal TIN for MB2 (the second macro block) is input to a second input thereof. The selection operation of this SEL1 is controlled by a select signal SS1.

The test circuit TC also comprises a selector SEL2 (a second selector). In this case, an output signal SQ from SEL1 is input to a first input of SEL2. Output signals M2OUT from MB2 are input to a second input thereof. The selection operation of this SEL2 is controlled by a select signal SS2.

In a first test mode for testing the macro block MB1 as shown in FIG. 7A (such as a scan mode), the selector SEL1 selects a number of the output signals M1OUT (such as I signals) from MB1 that are input to the first input thereof, and outputs the resultant output signal SQ to the first input of SEL2. The selector SEL2 outputs the output signal SQ from the selector SEL1, which is input to the first input thereof, to MB1 as a number of input signals M1IN (such as J signals). In this first test mode, a test pattern signal (logic test pattern) is input from a terminal DTIN (such as a data input terminal or scan-in terminal SCIN), as shown in FIG. 7A. The test is done by comparing the result that is output from a terminal DTOUT (such as a data output terminal or a scan-out terminal SCOUT) with an expected value.

In a second test mode for testing MB2, on the other hand, SEL1 takes a number of the test input signals TIN (such as I signals) for MB2, which are input to the second input thereof, and outputs them to MB2 as a number of input signals M2IN (such as I signals), as shown in FIG. 7B. In addition, SEL2 takes a number of the output signals M2OUT (such as J signals) from MB2, which are input to the second input thereof, and outputs them as test output signals TOUT (such as J signals) for MB2. In this second test mode, test input signals (a logic test pattern and a transmission data signal) are input from terminals TPI. Test output signals (the results of the logic test pattern and a reception data signal) that are output from terminals TPO are compared with expected values and are inspected.

Note that in an ordinary operating mode that is not the first and second test modes (a mode in which the integrated circuit operates in a normal manner), the output signals M1OUT from the macro block MB1 are input through the selector SEL1 to the macro block MB2 as the input signals M2IN to the macro block MB2. The output signals M2OUT from the macro block MB2 are input through the selector SEL2 to the macro block MB1 as the input signals M1IN to the macro block MB1.

The test input signals TIN are input from the test input terminals TPI through the test transmission buffer TXB that was described with reference to FIG. 2, to the selector SEL1. Similarly, the test output signals TOUT are output from the selector SEL2 through the test reception buffer RXB described with reference to FIG. 2, to the test output terminals TPO.

Figure 6:
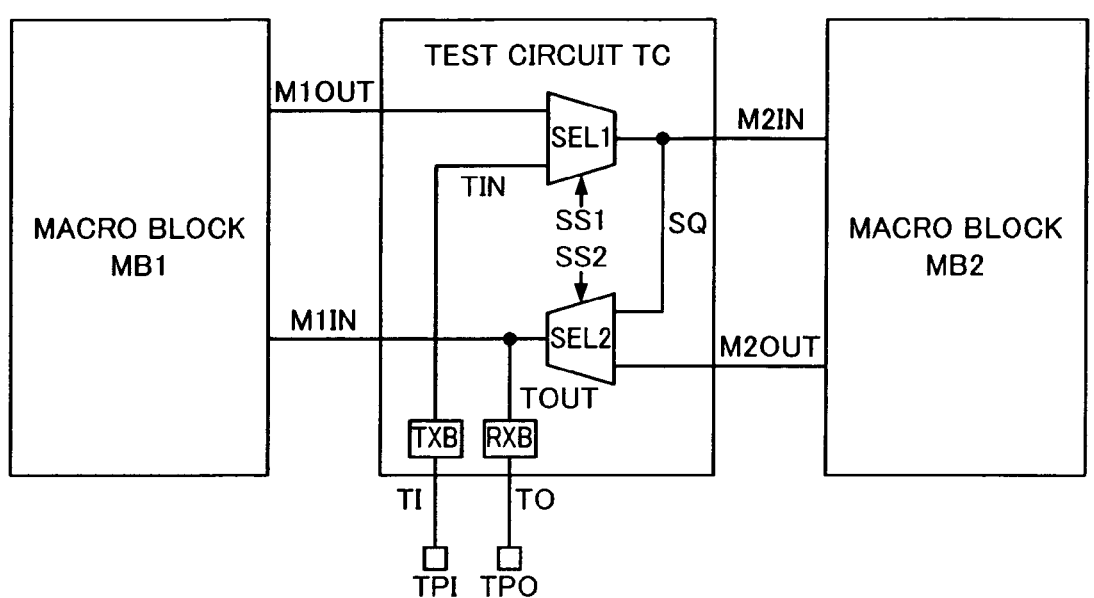
FIG. 6 shows an example of the configuration of the test circuit that comprises selectors.

The test circuit TC of this embodiment shown in FIG. 6 makes it possible to detect faults (wiring defects) in a connecting portion 12 between the macro block MB1 and the test circuit TC, using the first test mode shown in FIG. 7A. It is also possible to detect faults in a connecting portion 14 between the test circuit TC and the macro block MB2 in the second test mode shown in FIG. 7B. As a result, this makes it possible to detect faults in the connecting portion 10 between the macro blocks MB1 and MB2 of FIG. 1.

Moreover, the test pattern for detecting faults in the connecting portion 12 by the first test mode of FIG. 7A can be created in a comparatively simple manner (automatic generation). It is also simple to detect faults in the connecting portion 14 by the second test mode of FIG. 7B. In addition, the use of the test input signals TIN and the test output signals TOUT makes it possible to simplify these tests, even when the macro block MB2 comprises analog circuits such as a physical-layer circuit for communications. This embodiment therefore makes it possible to shorten the test pattern development period and reduce the cost thereof, and also increase the fault detection ratio and thus improve the reliability of the integrated circuit.

5. Scan Method

It is desirable that the first test mode of FIG. 7A is a scan mode in which testing is done by a scan method. As shown by way of example in FIG. 8, a scan path is set up, not only for the macro block MB1 but also for the test circuit TC. In other words, not only flip-flops within the macro block MB1 but also flip-flops within the test circuit TC are replaced by scan FFs (scan circuits), and a scan path (a scan chain) linking those scan FFs is created. That is to say, the macro block MB1 and the test circuit TC are viewed as a single macro block MB12 and a known scan test tool is used to insert scan FFs into the net list for MB12 (setting a scan path).

Figure 9A:
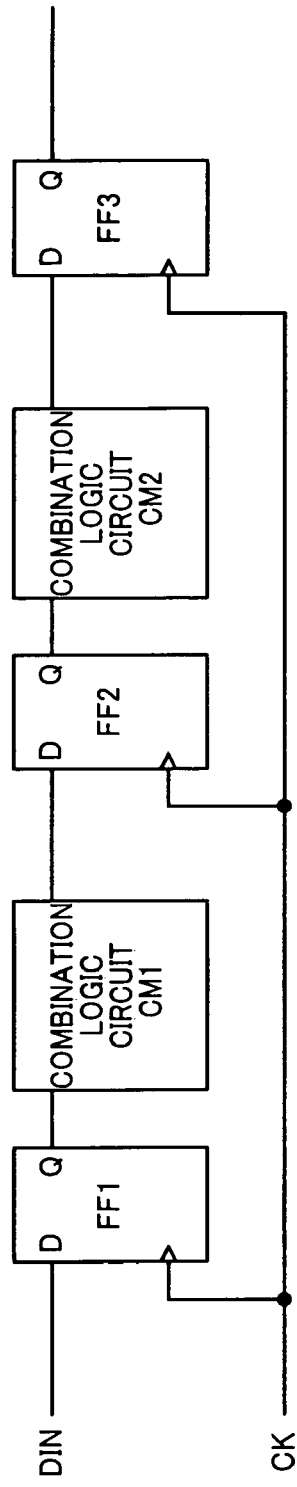
FIGS. 9A and 9B are illustrative of the scan method.
Figure 9B:
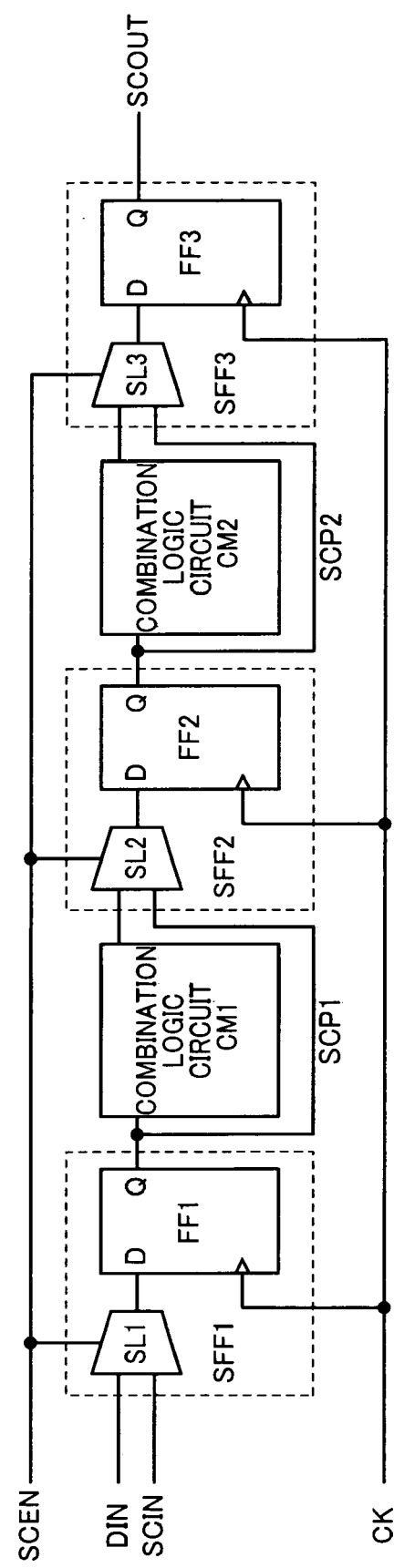

A circuit comprising flip-flops FF1, FF2, and FF3 and combination logic circuits CM1 and CM2 is shown by way of example in FIG. 9A. When this circuit is tested by the scan method, the flip-flops FF1, FF2, and FF3 are replaced by scan flip-flops SFF1, SFF2, and SFF3 that have selectors SL1, SL2, and SL3, as shown in FIG. 9B. Scan paths SCP1 and SCP2 are provided to bypass the ordinary paths through the combination logic circuits CM1 and CM2.

First of all, a scan enable signal SCEN is set to a first level (such as high level) and a scan path side (the SCIN side) is selected in the selectors SL1, SL2, and SL3. A test pattern signal is input sequentially in series from the scan-in terminal SCIN to set a test pattern signal with respect to the flip-flops FF1, FF2, and FF3.

The scan enable signal SCEN is then set to a second level (such as low level) and an ordinary path side is selected in the selectors SL1, SL2, and SL3. A clock signal CK is made active for one clock pulse, by way of example, and output signals from the flip-flops FF1 and FF2 are input to the combined circuits CM1 and CM2 and also output signals from CM1 and CM2 are held in FF2 and FF3.

The scan enable signal SCEN is then set to the first level, to select the scan path side (SCIN side) in the selectors SL1, SL2, and SL3. A test result signal that is held in the flip-flops FF1, FF2, and FF3 is output serially from the scan-out terminal SCOUT through the scan paths SCP1 and SCP2, for comparison with an expected value. This makes it possible to test for element defects in the flip-flops FF1, FF2, and FF3 and combination logic circuits CM1 and CM2, as well as wiring defects in the circuit therebetween.

Figure 10:
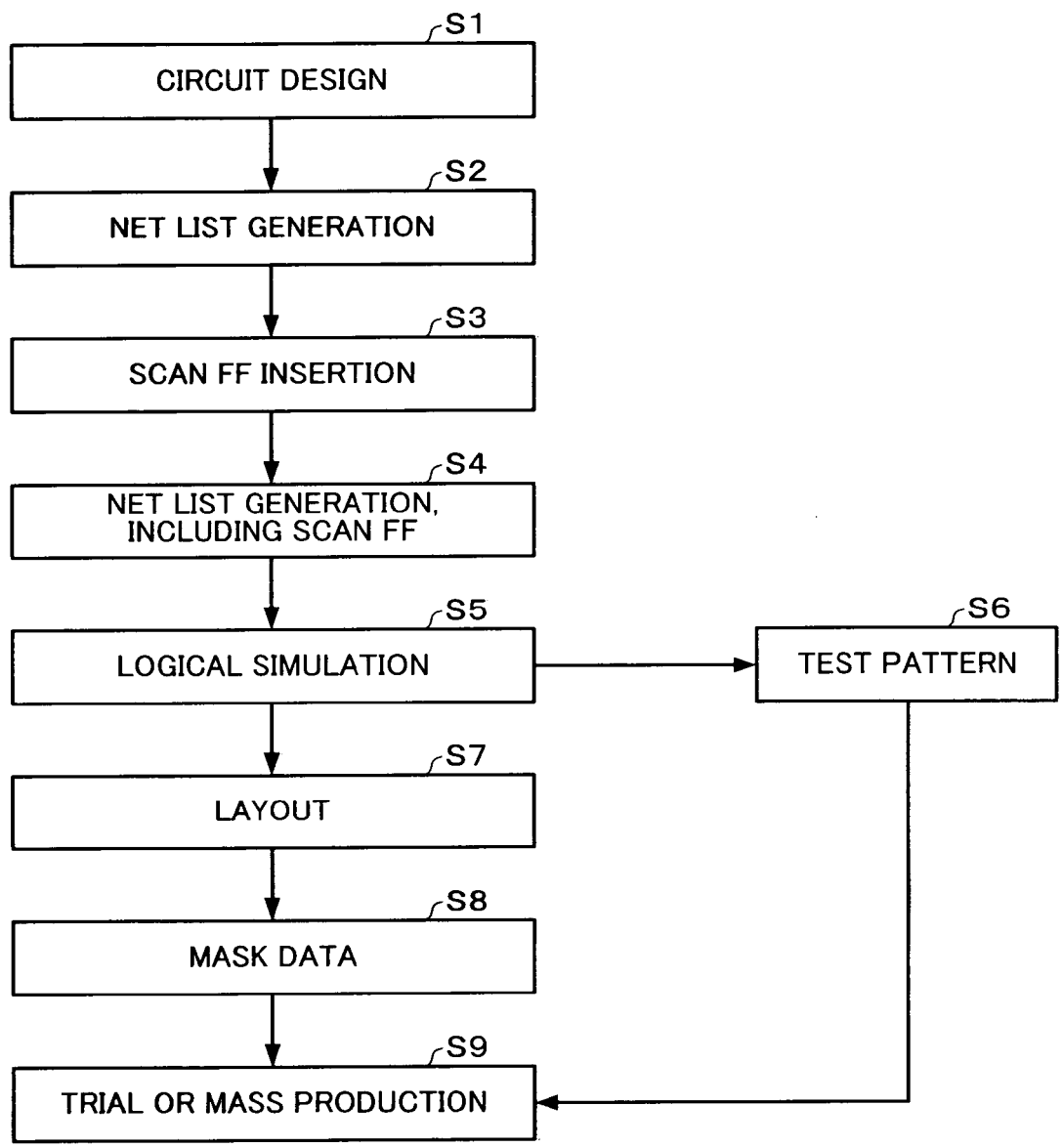
FIG. 10 is a flowchart of a test method that utilizes the scan method.

A flowchart of a test method using the scan method is shown in FIG. 10. First of all, the circuit is designed and a net list of the designed circuit is created (steps S1 and S2). A known scan test tool is then used to insert scan FFs into the designed circuit and a net list comprising the scan FFs is created (steps S3 and S4). A logic simulation is performed, using the net list that comprises the scan FFs, and a test pattern is created (automatic generation) (steps S5 and S6). The circuit is subsequently laid out and mask data is generated (steps S7 and S8). The test pattern created (automatically generated) in step S6 is used for testing trial products or mass-produced products (step S9).

Use of the above-described scan method increases the size of the macro block slightly, but it enables a simplification of the generation of test patterns and an increase in the fault detection rate, because it makes it possible to cut out the combination logic circuits between the scan FFs and thus perform partial testing.

Figure 8:
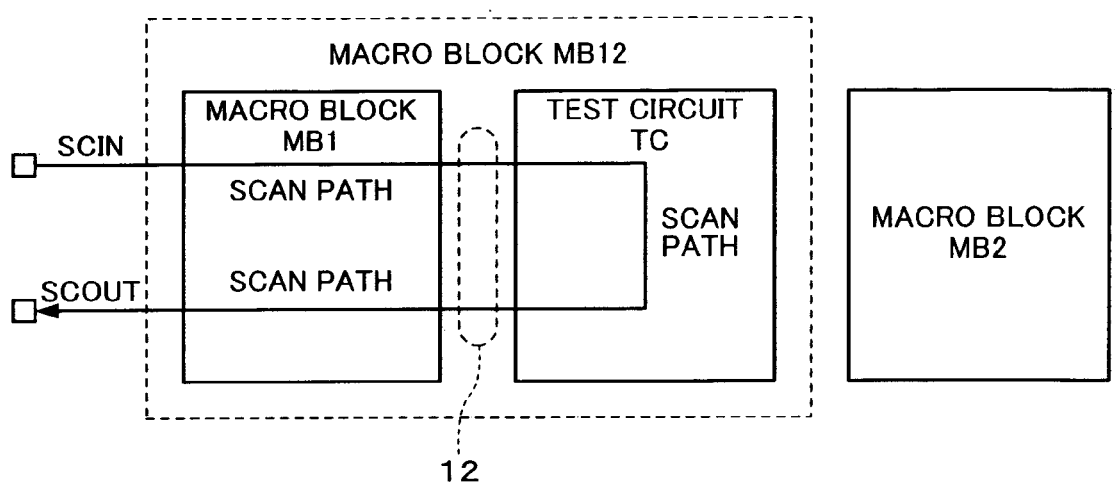
FIG. 8 is illustrative of a method of setting scan paths for the macro block and test circuit.

With this embodiment, the macro block MB1 and the test circuit TC are viewed as a single macro block MB12, as shown in FIG. 8, and a scan path from the scan-in terminal SCIN to the scan-out terminal SCOUT is set for the macro block MB1 and the test circuit TC (a scan FF is inserted). It therefore becomes simple to create a test pattern that enables the detection of faults (wiring defects) in the connecting portion 12 between the macro block MB1 and the test circuit TC, at a high fault detection rate. This makes it possible to reduce the test pattern development period, at a lower cost.

6. Dummy Scan Flip-flops

Figure 11:
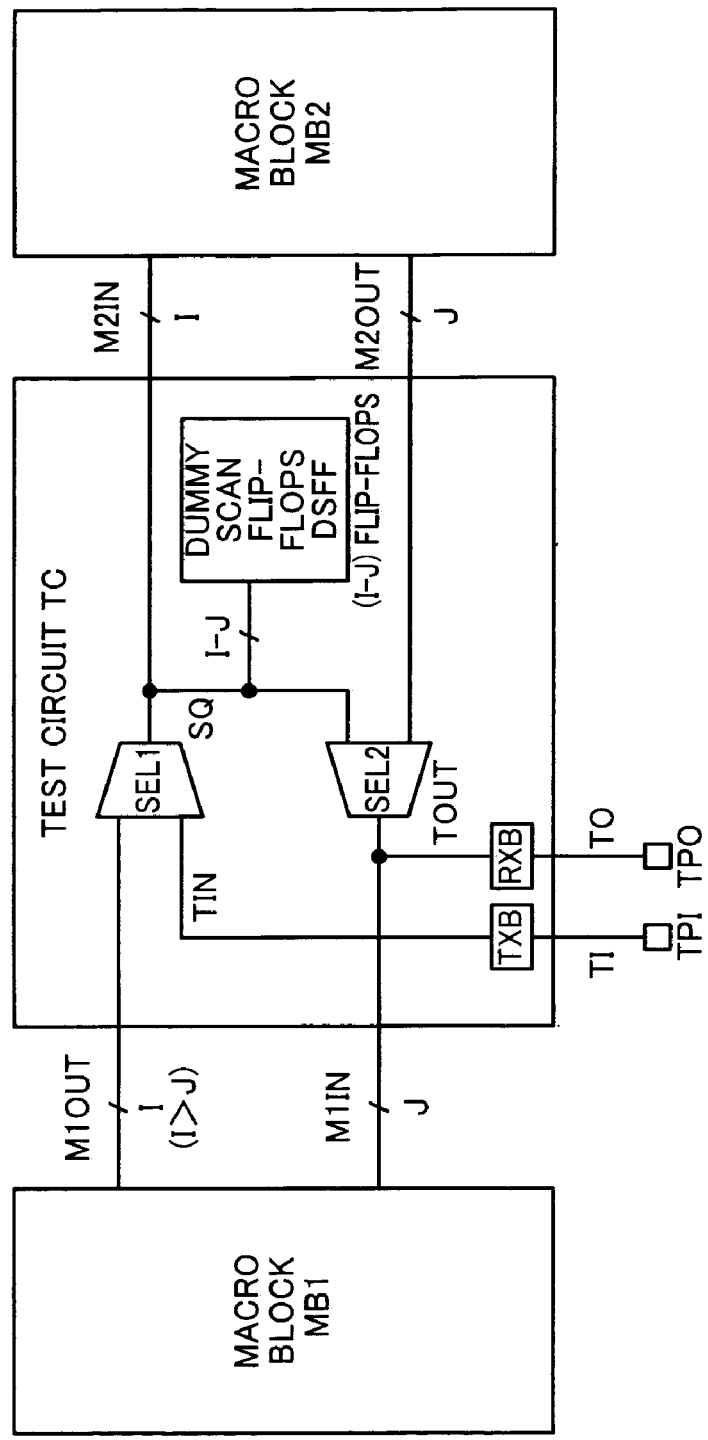
FIG. 11 shows an example of a test circuit that comprises dummy scan FFs.

With this embodiment, one or a plurality of dummy scan flip-flops DFSS could be comprised within the test circuit TC, as shown in FIG. 11.

As shown by way of example in FIG. 11, the number of output signals M1OUT from the macro block MB1 is I and the number of input signals from the test circuit TC to MB1 is J (where I>J, and I and J are each a natural number or an integer greater than or equal to two). In other words, the number of output signals M1OUT is greater than the number of input signals M1IN. To implement the method of FIG. 8 of setting an integrated scan path for the test circuit TC and the macro block MB1 when there is a difference in the numbers of signals in this manner, one or a plurality of dummy scan flip-flops DSFF is comprised within the test circuit TC as shown in FIG. 11.

More specifically, (I-J) dummy scan flip-flops DSFF are provided in the test circuit TC to hold (I-J) output signals (the Jth to Ith output signals) of the I output signals (first to Ith output signals). In the scan mode described with reference to FIG. 8 (the first test mode), the configuration is such that the dummy scan flip-flops DSFF output the held output signals through the scan path (the path from the scan-in terminal, through the scan flip-flops, to the scan-out terminal). In other words, the DSFFs hold signals that have been input from the scan flip-flops of the previous stage, and then output the held signals to the scan flip-flops in the subsequent stage.

Figure 12A:
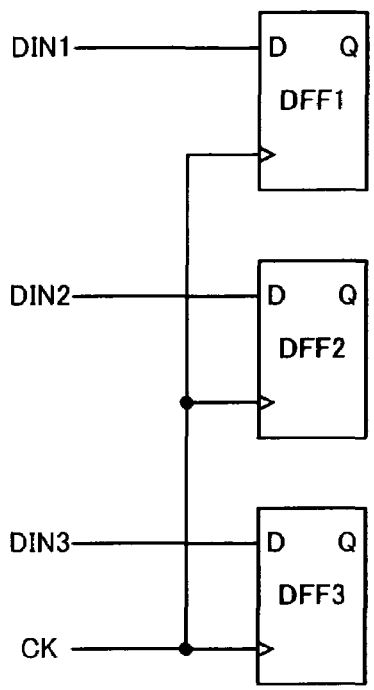
FIGS. 12A, 12B, and 12C are illustrative of the dummy scan FFs.

For example, the three (generally speaking: (I-J)) dummy flip-flops DFF1, DFF2, and DFF3 shown in FIG. 12A are comprised within the net list created at step S2 in FIG. 10. (I-J) output signals DIN1, DIN2, and DIN3 (the Jth to Ith output signals) of the I output signals from the selector SEL1 are connected to data terminals D of DFF1, DFF2, and DFF3.

Figure 12B:
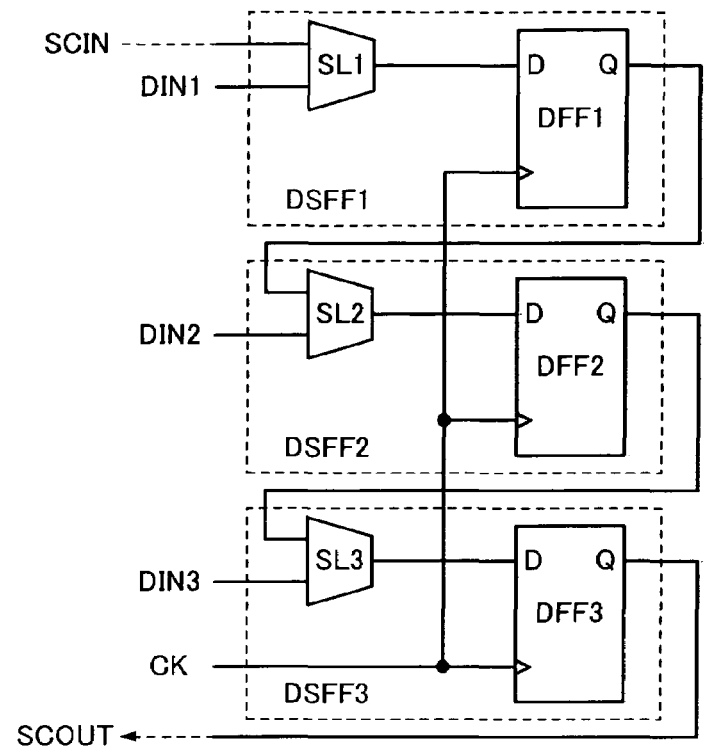

The scan method described at steps S4 and S5 of FIG. 10 replaces DFF1, DFF2, and DFF3 in the net list with the dummy scan flip-flops DSFF1, DSFF2, and DSFF3 of FIG. 12B (dummy flip-flops that are meaningless in the ordinary operating mode and are disabled therein).

During the scan mode, the DIN side is selected for SL1, SL2, and SL3, and signal DIN1, DIN2, and DIN3 (the (I-J) output signals of the scan flip-flops of the selector SEL1 or the stage after SEL1) are held in DFF1, DFF2, and DFF3. Subsequently, the SCIN side is selected for SL1, SL2, and SL3, and the signals DIN1, DIN2, and DIN3 held in DFF1, DFF2, and DFF3 (DSFF1 to DSFF3) are output serially from SCIN, through the scan path to SCOUT.

Figure 12C:
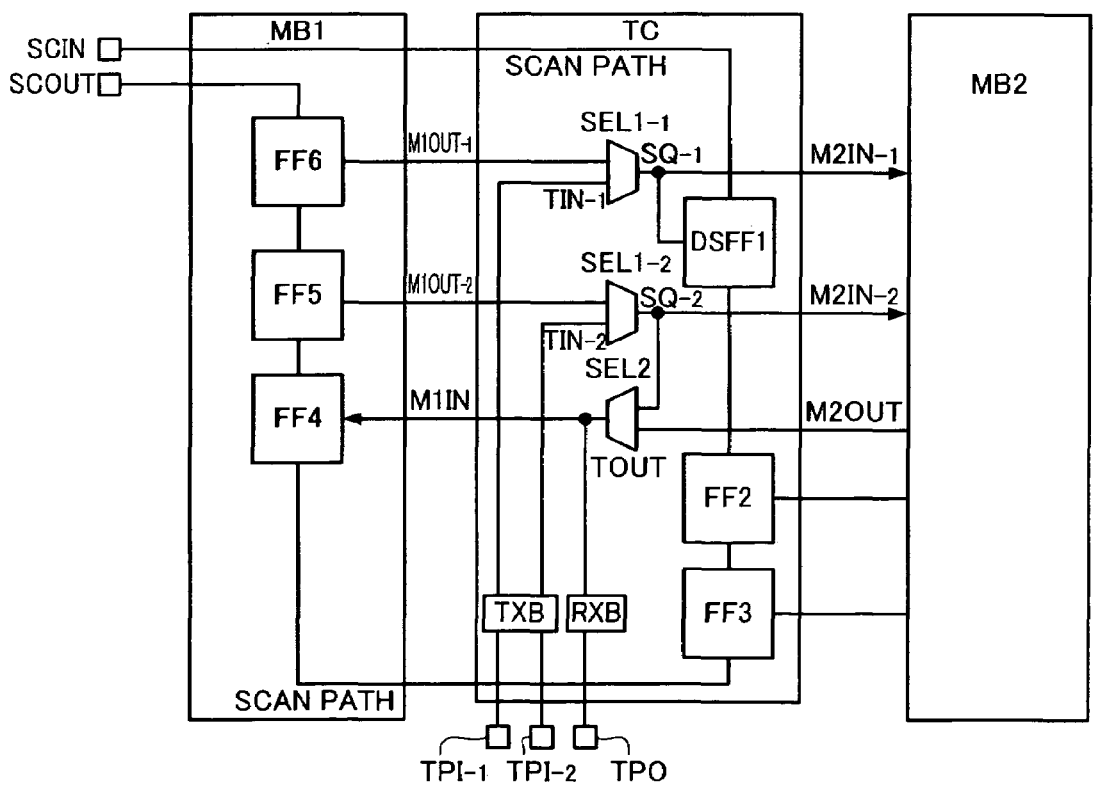

The situation of the scan path that is set for the macro block MB1 and the test circuit TC is shown schematically in FIG. 12C. As shown by way of example in FIG. 12C, since there are two (I) output signals M1OUT-1 and M1OUT-2 from MB1 to TC and one input signal from TC to MB1, one (I-J) dummy scan flip-flop DSFF1 is provided.

The output signal M1OUT-1 from a flip-flop FF6 within MB1 is input to the first input of SEL1-1 (a first selector) and a test input signal TIN-1 from a test input terminal TPI-1 (TXB) is input to the second input thereof. An output signal SQ-1 of SEL1-1 is input to the dummy scan flip-flop DSFF1 provided within TC.

Similarly, the output signal M1OUT-2 from a flip-flop FF5 within MB1 is input to the first input of SEL1-2 (another first selector) and a test input signal TIN-2 from a test input terminal TPI-2 (TXB) is input to the second input thereof. An output signal SQ-2 of SEL1-2 is input to the data terminal of the flip-flop FF2 provided within TC.

The output signal SQ-2 from SEL1-2 is also input to the first input of SEL2 (the second selector) and the output signal M2OUT from MB2 is input to the second input thereof. The output signal TOUT from SEL2 is output to the test output terminal TPO (RXB), or to a flip-flop FF4 within MB1.

In the scan mode, the signals (values) held in DSFF1, FF2, FF3, FF4, FF5, and FF6 through the scan path from SCIN to SCOUT are output in series from SCOUT, enabling the implementation of testing by this scan method.

The above-described configuration makes it possible to detect wiring defects in the remaining (I-J) signals M1OUT by the scan method described with reference to FIG. 8, even when the number I of signals M1OUT is greater than the number J of signals M1IN, as shown in FIG. 11. In other words, these (I-J) signals can be output along the scan path from SCIN, through MB1 and TC, to SCOUT when in scan mode. As a result, it is possible to detect faults more reliably.

Note that the dummy flip-flops DFF1, DFF2, and DFF3 before the substitution for scan flip-flops have nothing connected to Q terminals thereof in FIG. 12A. There is a possibility that these flip-flops DFF1, DFF2, and DFF3 with nothing connected to the Q terminals could be perceived as disabled flip-flops and deleted, depending on the specifications of the net list creation tool. To prevent such a situation, therefore, the Q terminals of DFF1, DFF2, and DFF3 could be connected to nodes that have no adverse effect on ordinary operation (such as nodes of the test buffer that will be described later).

7. Detailed Example 7.1 Overall Configuration

Figure 13:
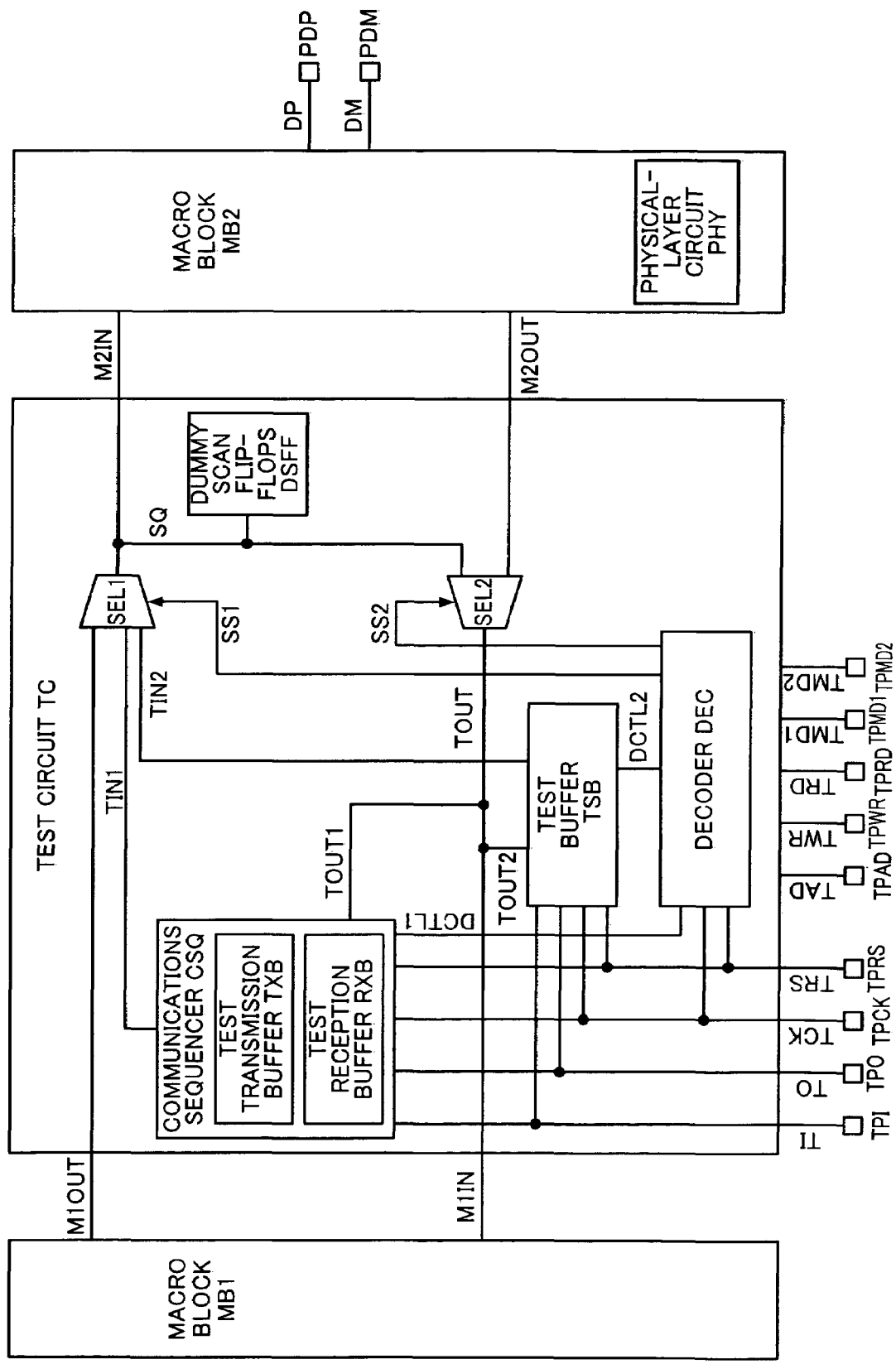
FIG. 13 shows a detailed example of the test circuit of this embodiment.

A detailed example of the configuration of the test circuit TC is shown in FIG. 13. Note that the test circuit of this embodiment need not necessarily comprise all of the structural components shown in FIG. 13; some of them could be omitted.

In FIG. 13, TPI denotes a test input terminal and TPO denotes a test output terminal. Similarly, TPCK denotes a test clock terminal and TPRS denotes a reset terminal. TPAD, TPWR, and TPRD denote an address terminal, a write terminal, and a read terminal for the buffer (register). TPMD1 and TPMD2 denote test mode terminals. PDP and PDM denote terminals for differential signals DP and DM (data positive and data negative) as defined under USB.

MB2 in FIG. 13 denotes a macro block that comprises a physical-layer circuit PHY for data communications. This MB2 is a macro block such as one that conforms to the UTMI specifications (generally speaking: communications macro block specifications). Note that this macro block MB2 also has functions for receiving a transmission data signal that has been transmitted over USB (a first bus) by using DP and DM, as a received data signal in loopback mode.

The test circuit TC comprises a communications sequencer CSQ. This communications sequencer CSQ is a sequencer for performing signal transmission and reception processing (handshake processing) by a predetermined communications protocol (a communications protocol conforming to the communications macro block specification) to and from the macro block MB2. A transmission data signal from this communications sequencer CSQ (the test transmission buffer TXB) is input to the selector SEL1 as a test input signal TIN1 for MB2. Similarly, a test output signal TOUT1 (TOUT) from the selector SEL2 is input to the communications sequencer CSQ (the test reception buffer RXB) as a reception data signal.

More specifically, the communications sequencer CSQ performs processing for transmitting a transmission data signal for the macro block MB2 through the selector SEL1 to MB2, in the second test mode that was described with reference to FIG. 7B. It also performs processing for receiving a reception data signal from MB2 through SEL2.

The communications sequencer CSQ comprises the test transmission buffer TXB and the test reception buffer RXB. TXB is a buffer (register) that stores the transmission data signal (TIN1) for MB2. RXB is a buffer (register) that stores a reception data signal (TOUT1) from MB2. In other words, TXB stores a signal TI that has been input from the test input terminals TPI, as a transmission data signal. RXB stores a reception data signal from MB2 and outputs the stored reception data signal as a signal TO to the test output terminals TPO.

More specifically, the test transmission buffer TXB stores the transmission data signal TI that has been input from the test input terminals TPI. After the storing of the transmission data signal TI by TXB is complete (after a predetermined number of bytes of the transmission data signal have been stored), the communications sequencer CSQ performs processing to transmit the stored transmission data signal through the selector SEL1 to the macro block MB2. The communications sequencer CSQ also performs processing to receive the reception data signal TOUT1 from MB2, which has been set to loopback mode. The test reception buffer RXB stores the received reception data signal TOUT1 and outputs the stored reception data signal to the test output terminals TPO.

Note that the configuration could be such that only one of the transmission buffer TXB and the reception buffer RXB is provided in the test circuit TC. TXB and RXB could be provided within the communications sequencer CSQ or they could be provided externally.

The test circuit TC comprises a test buffer TSB. This TSB is a buffer (register) that stores a test input signal and a test output signal. More specifically, TSB stores the signal TI from the test input terminals TPI and outputs it as a test input signal TIN2 to the selector SEL1. TSB also stores a test output signal TOUT2 (TOUT) from the selector SEL2 and outputs it as the signal TO to the test output terminals TPO.

The test circuit TC also comprises a decoder DEC. This DEC outputs control signals to the various circuits of the test circuit, based on signals from the test terminals of the integrated circuit. More specifically, an address signal TAD for specifying addresses (register addresses) in the buffers TXB, RXB, and TSB and a write signal TWR and a read signal TRD for those buffers are input to the decoder DEC. In addition, test mode signals TMD1 and TMD2 (signals for switching between the first and second test modes and for switching between the test modes and the ordinary operating mode), a test clock signal TCK, and a test reset signal TRS are input thereto. The decoder DEC performs decoding processing based on these signals that are input from the test terminals, and generates control signals DCTL1 and DCTL2 for the communications sequencer CSQ (TXB, RXB) and the test buffer TSB and the select signals SS1 and SS2 for the selectors SEL1 and SEL2.

For example, the communications sequencer CSQ (TXB, RXB) performs processing for storing the transmission data signal and the reception data signal in TXB and RXB and outputting the transmission data signal and the reception data signal from TXB and RXB, based on the control signal DCTL1 from the decoder DEC and the test clock signal TCK. The test buffer TSB performs processing for storing the test input signal and the test output signal in the TSB and outputting the test input signal and the test output signal from the TSB, based on the control signal DCTL2 from the decoder DEC and the test clock signal TCK.

When both of the signals TMD1 and TMD2 are at low level (a first level), the decoder DEC sets the select signal SS1 to high to cause the selection of the signals M1OUT to the selector SEL1 or set the signal SS1 to low to cause the selection of M2OUT to the selector SEL2. This turns the operating mode into an ordinary operating mode (a mode that is not a test mode).

When the signal TMD1 is at high (a second level), both the signals SS1 and SS2 are set to high to cause the selection of the signals M1OUT to SEL1 and the selection of the signal SQ to SEL2. This turns the operating mode to the first test mode for testing the macro block MB1.

When the signal TMD2 is at high, both the signals SS1 and SS2 are set to low to cause the selection of the signals TIN1 and TIN2 to SEL1 and also the signals M2OUT to SEL2. This turns the operating mode to the second test mode for testing the macro block MB2.

7.2 Buffer Configuration

An address map of the test transmission buffer TXB, the test reception buffer RXB, and the test buffer TSB is shown in FIG. 14.

In this embodiment, each of the transmission buffer TXB and the reception buffer RXB has a four-stage (generally speaking: a plurality of stages) buffer configuration (FIFO configuration). In other words, TxBuf0, TxBuf1, TxBuf2, and TxBu3 in FIG. 14 correspond to the four stages of the transmission buffer TXB, and RxBuf0, RxBuf1, RxBuf2, and RxBu3 correspond to the four stages of the reception buffer RXB. Each buffer in these four stages has an 8-bit configuration. In other words, TxBuf0[7] to TxBuf0[0] in FIG. 14 represent the bits of TxBuf0. The other buffers TxBuf1, TxBuf2, and TxBu3 are similar. In addition, RxBuf0[7] to RxBuf0[0] represent the bits of RxBuf0. The other buffers RxBuf1, RxBuf2, RxBuf3 are similar.

In the embodiment shown in FIG. 14, if the addresses specified by the signal TAD from the terminal TPAD are in the range of 0x0 to 0x7 (hexadecimal notation), addresses in one or other of the transmission buffer TXB and the reception buffer RXB are specified. When the write signal TWR from the terminal TPWR becomes active, the transmission buffer TXB is specified, whereas when the read signal TRD from the terminal TPRD becomes active, the reception buffer RXB is specified.

When the addresses specified by the signal TAD are in the range of 0x8 to 0xF, on the other hand, addresses in the test buffer TSB are specified. The specification of read or write is done by the read signal TRD or the write signal TWR.

Functions such as TXMODE, XCVRSELECT, TERMSELECT, . . . TXSTART are allocated to the bits of the test buffer TSB, as shown in FIG. 14.

For example, TXMODE is a bit that sets the transmission mode of the communications sequencer CSQ. If TXMODE is set to 0, the communications sequencer CSQ transmits four bytes (generally speaking: a plurality of bytes) of transmission data and stops. If TXMODE is set to 1, on the other hand, CSQ continues to transmit single bytes of transmission data that has been stored in TxBuf0.

In addition, bits such as XCVRSELECT, TERMSELECT, OPMODE1, . . . SUSPEND are bits for setting the input terminals (M2IN) of the macro block MB2 to a desired signal level (high level or low level). Bits such as MonRX-ACTIVE, MonRXERROR, MonLINESTATE1, and MonLINESTATE0 are bits for monitoring the signal level of the output terminals (M2OUT) of the macro block MB2.

TXSTART is a bit that instructs the start of transmission (test transmission) with respect to the communications sequencer CSQ, such that setting TXSTART to 1 starts the transmission. When the transmission is complete, TXSTART is cleared to 0. When TXMODE is 1, 0 is written to TXSTART to stop the transmission.

In an integrated circuit, an increase in the number of terminals leads to an increase in the fabrication cost. For that reason, it is desirable to reduce the number of test terminals to as few as possible. With this embodiment, the numbers of the test terminals TPI and TPO of FIG. 13 are reduced by the method described below.

Figure 15A:
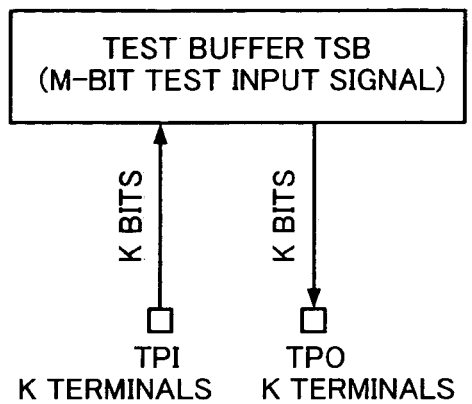
FIG. 15A to 15D are illustrative of a test buffer, test transmission buffer, and test reception buffer of this embodiment.
Figure 15B:
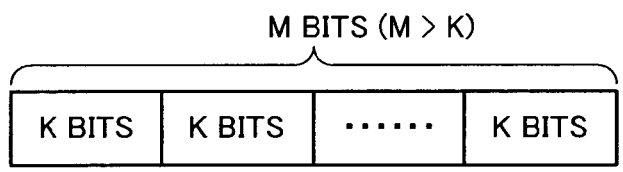

Assume that the input signal necessary for testing the macro block MB2 has M bits, by way of example. In such a case, the test buffer TSB of this embodiment inputs K bits at a time of these M bits of the test input signal (where M>K, and M and K are each a natural number or an integer greater than or equal to two) from a number K of the test input terminals TPI, as shown in FIGS. 15A and 15B. The stored signal is output to the selector SEL1 as the test input signal TIN2. This makes it possible to reduce the number of the test input terminals TPI to K terminals, although M terminals were necessary originally.

If all of the bits XCVRSELECT to SUSPEND of FIG. 14 were set to external terminals as TPI, by way of example, 12 (M) terminals would be necessary. In contrast thereto, the test buffer TSB takes in 4 bits (K bits) at a time of the 12 bits (M bits) of the test input signals (XCVRSELECT to SUSPEND) from TPI and stores them, as shown in FIGS. 15A and 15B. This means that the number of TPI terminals can be set to four, enabling a reduction in the number of terminals of the integrated circuit.

Figure 15C:
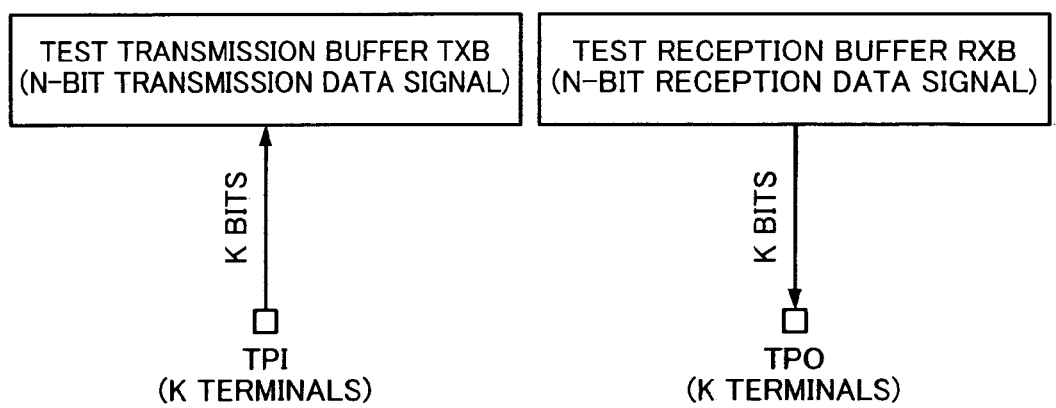
Figure 15D:
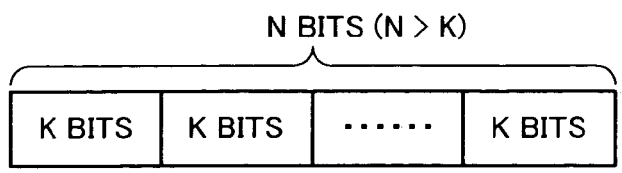

Assume that the number of bits of the transmission data signal and the reception data signal is N. In such a case, the test transmission buffer TXB of this embodiment inputs K bits at a time of these N bits of the transmission data signal (test input signal) from K test input terminals TPI (where N>K, and N and K are each a natural number or an integer greater than or equal to two), and stores them, as shown in FIGS. 15C and 15D. The stored signal is output to the selector SEL1 as the test input signal TIN1. This makes it possible to reduce the number of the test input terminals TPI to K terminals, from the N terminals that were necessary originally. Similarly, the test reception buffer RXB stores N bits of the reception data signal (the test output signal) from the macro block MB2 and outputs the stored reception data signal K bits at a time to K test output terminals TPO, as shown in FIGS. 15C and 15D. This means that the number of TPO terminals can be reduced to K, although N terminals were necessary originally.

If all of the bits TxBuf0[7] to TxBuf0[0] of FIG. 14 were set to external terminals as TPI and all of the bits RxBuf0[7] to RxBuf0[0] were set to external terminals as TPO, the numbers of each of TPI and TPO would be eight (N terminals), making it necessary to have a total of 16 terminals. In contrast thereto, FIGS. 15C and 15D show that the transmission buffer TXB inputs the 8-bit (N-bit) transmission data signal four bits (K bits) at a time from TPI, and stores it. Similarly, the reception buffer RXB outputs the 8-bit reception data signal four bits at a time to TPO. This makes it possible to set the numbers of TPI and TPO terminals to four (K terminals) each, enabling a reduction in the number of terminals of the integrated circuit.

In addition, the four (K) terminals TPI and TPO are connected in common to the buffers TXB, RXB, and TSB, as shown in FIGS. 13 and 14, and the address signal TAD is used to specify the address of each bit in the buffers TXB, RXB, and TSB. This enables a further decrease in the number of terminals of the integrated circuit.

7.3 Communications Sequencer

Figure 16:
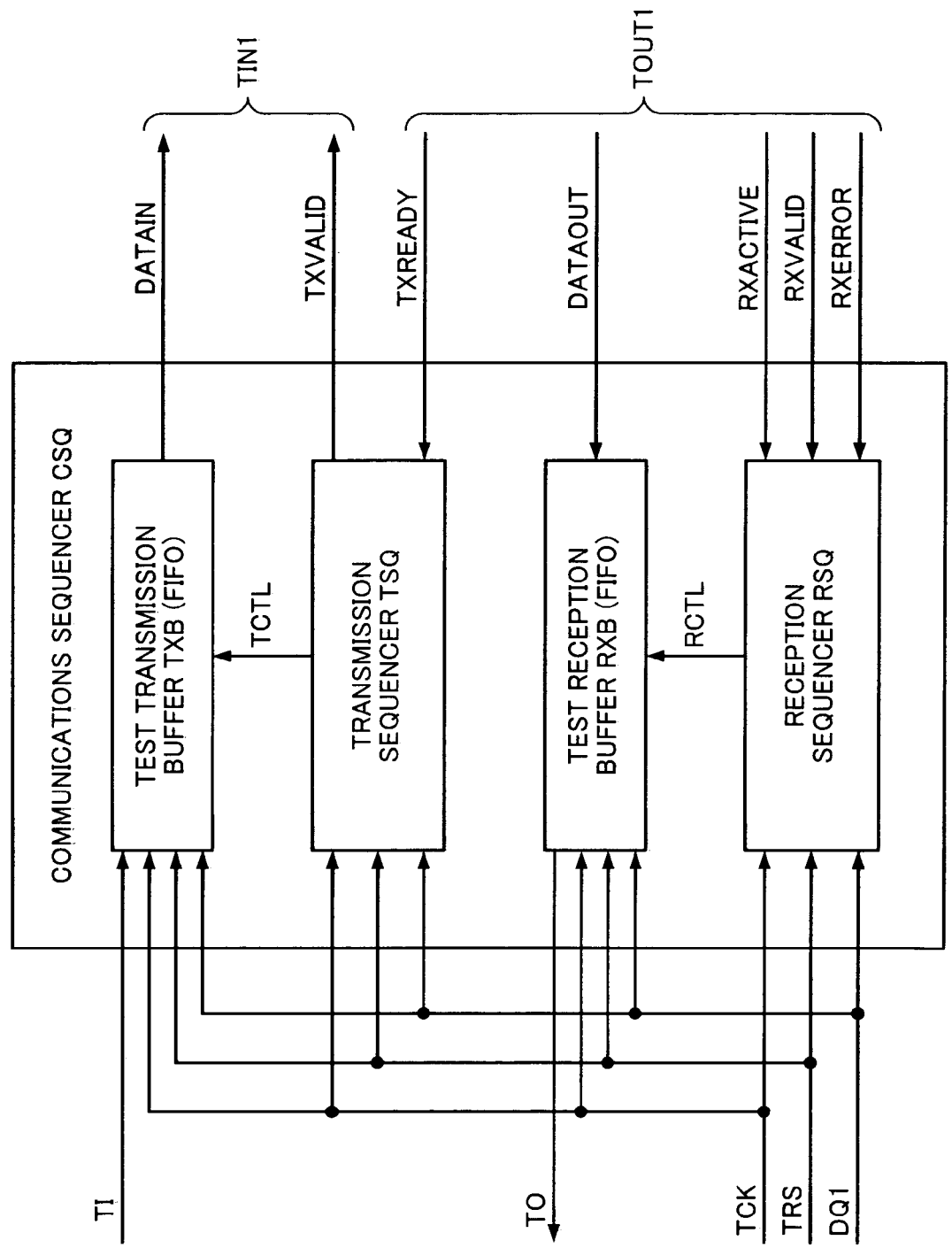
FIG. 16 shows an example of the configuration of the communications sequencer.

An example of the configuration of the communications sequencer CSQ is shown in FIG. 16. It should be noted, however, that the configuration of the communications sequencer CSQ is not limited to that shown in FIG. 16.

The communications sequencer CSQ comprises a transmission sequencer TSQ. This TSQ is a sequencer for implementing transmission processing with the macro block MB2 by handshake. More specifically, the transmission sequencer TSQ outputs a signal TXVALID (transmission start signal), which indicates that a transmission data signal DATAIN is valid, to the macro block MB2. MB2 views DATAIN during the period in which TXVALID is active as one packet. This signal TXVALID is output as the signal TIN1 through SEL1 to MB2, as shown in FIG. 13.

The transmission sequencer TSQ receives a signal TXREADY, which indicates that the buffering of DATAIN is complete, from MB2. This signal TXREADY is input from MB2 through SEL2 to the transmission sequencer TSQ as the signal TOUT1, as shown in FIG. 13.

The transmission sequencer TSQ uses a control signal TCTL (such as a transmission start signal) to control the transmission buffer TXB. More specifically, it controls the storing of the signal TI from the test input terminals TPI by the transmission buffer TXB. It also controls the output of the signal DATAIN to the macro block MB2 by the transmission buffer TXB. In this case, the signal TI is stored in the transmission buffer TXB of this embodiment at a clock frequency CF2 that is lower than the clock frequency CF1 (such as 60 MHz), during the output of the signal DATAIN. This makes it possible to use the lower clock frequency CF2 for the storing of the signal TI, to maintain some leeway. It is therefore possible to obtain stable test results with few variations, even when there are large parasitic capacitances in the test input terminals TPI.

The communications sequencer CSQ comprises a reception sequencer RSQ. This RSQ is a sequencer for implementing reception processing with the macro block MB2 by handshake. More specifically, the reception sequencer RSQ receives from the macro block MB2 a signal RXACTIVE that indicates that there is activity on the bus, a signal RXVALID that indicates that a reception data signal DATAOUT is valid, and a signal RXERROR that indicates that there was an error during packet reception. These signals RXACTIVE, RXVALID, and RXERROR are input from MB2 of FIG. 13, through SEL2, to the reception sequencer RSQ as the signal TOUT1.

The reception sequencer RSQ uses a control signal RCTL to control the test reception buffer RXB. More specifically, it controls the storing of the signal DATAOUT from the macro block MB2 by the reception buffer RXB. It also controls the output of the signal TO to the test output terminals TPO by the reception buffer RXB. In this case, the configuration of this embodiment is such that the signal TO is output at a clock frequency CF3 that is lower than the clock frequency CF1 (such as 60 MHz), during the storing of the signal DATAOUT (CF3 could also be the same as CF2 ). This makes it possible to use the lower clock frequency CF3 for the output of the signal TO, to maintain some leeway. It is therefore possible to obtain stable test results with few variations, even when there are large parasitic capacitances in the test output terminals TPO.

Figure 17:
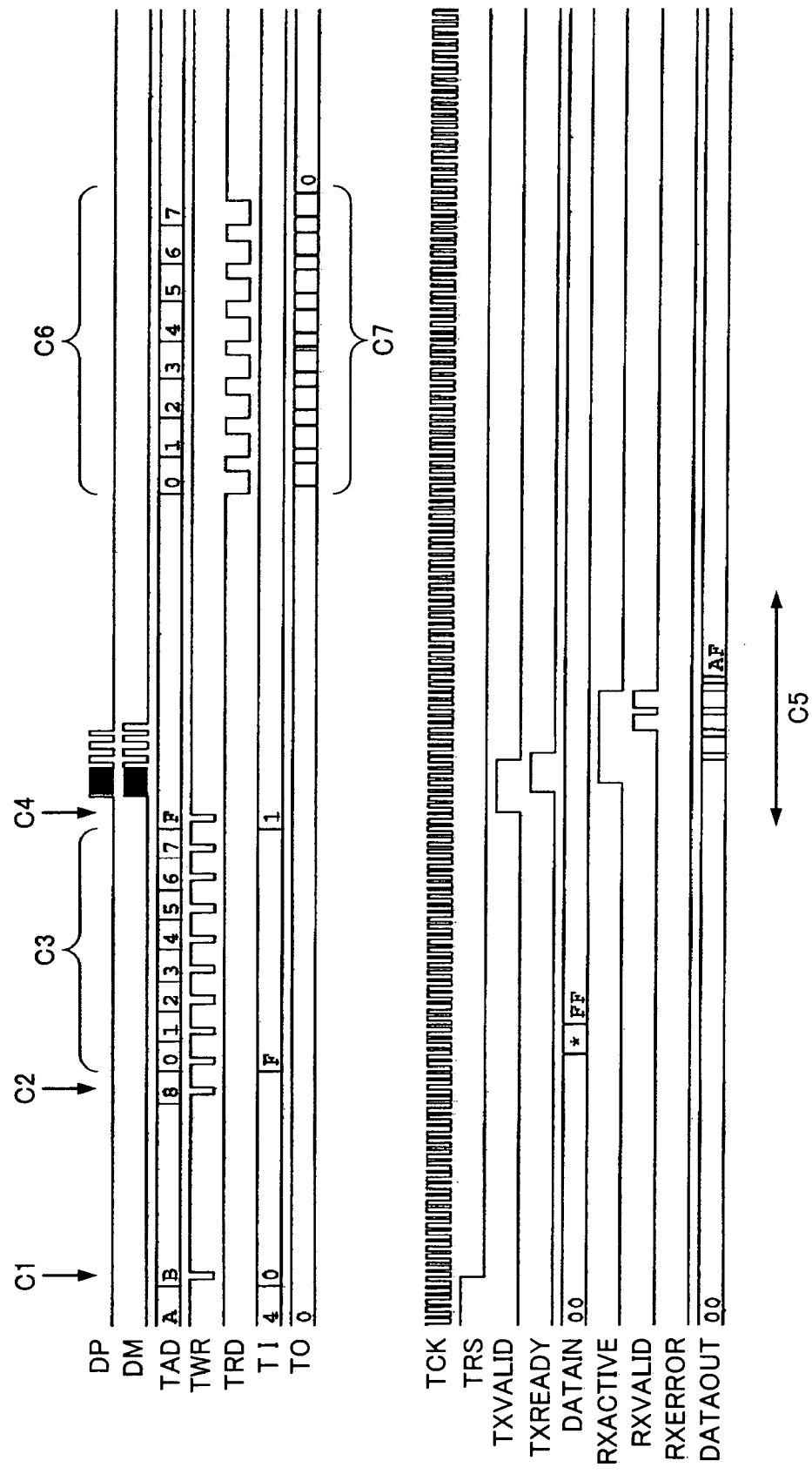
FIG. 17 is a waveform chart illustrating the operation of the test circuit and the communications sequencer.
Figure 18:
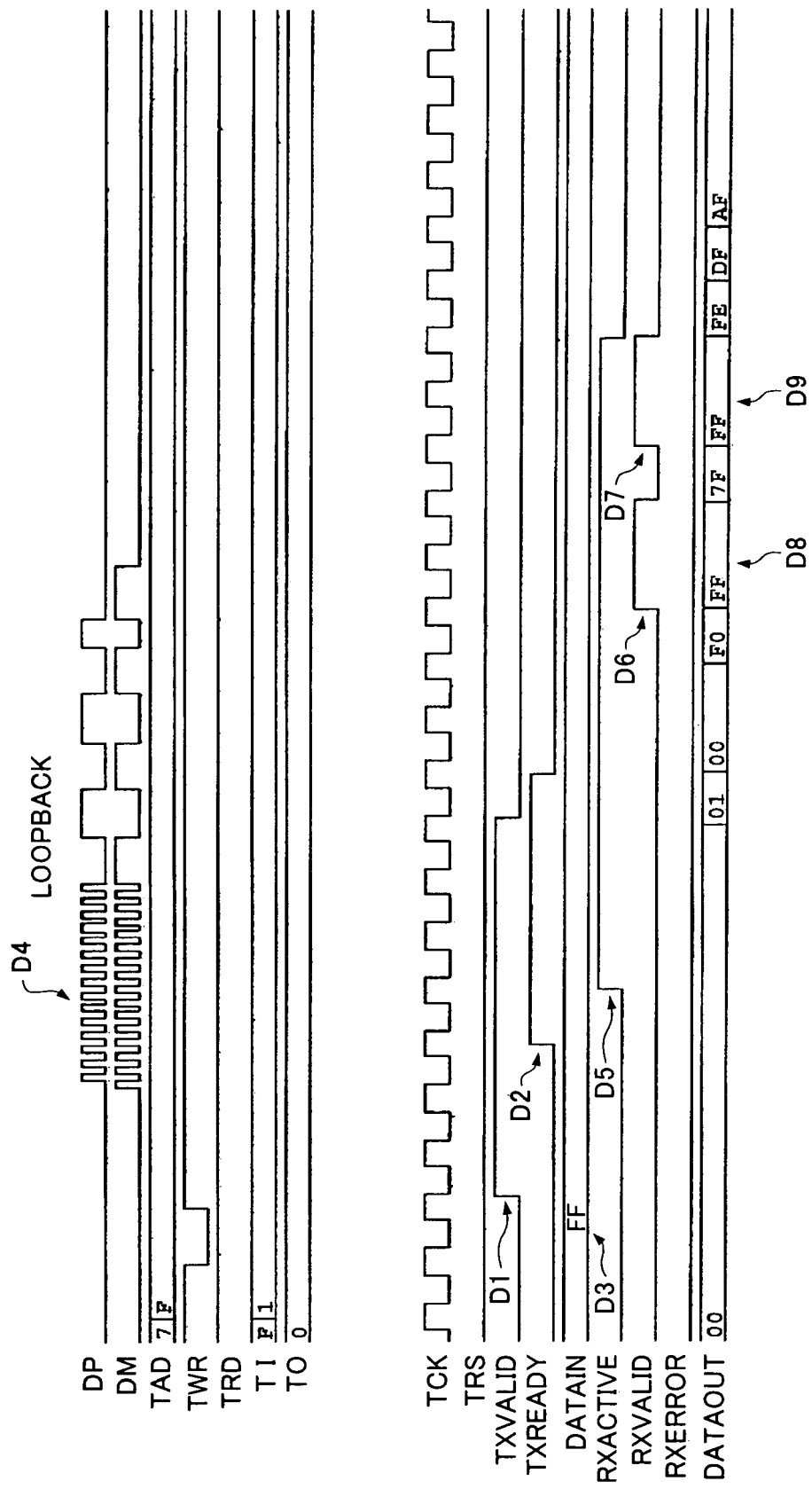
FIG. 18 is a waveform chart further illustrating the operation of the test circuit and the communications sequencer.

The description now turns to details of the operation of the test circuit TC and the communications sequencer CSQ, using the waveform charts shown in FIGS. 17 and 18.

First of all, all of the PLLSELECT, OSCENB, CLKSELECT1, and CLKSELECT0 signals of FIG. 14 are set to 0 by an external tester using the test terminals to set the address signal TAD to 0xB, the write signal TWR to active (low level), and also the signal TI to 0x0, as shown at C1. The tester then sets TXMODE of FIG. 14 to 0 by setting TAD to 0x8, TWR to active, and also TI to 0x0, as shown at C2. This sets the communications sequencer CSQ to a mode in which four bytes (a plurality of bytes) of the transmission data signal are transmitted sequentially.

The tester then writes 1 to all the bits of the four-stage buffers TxBuf0 to TxBuf3 of the transmission buffer TXB of FIG. 14, by setting the address signal TAD to 0x0 to 0x7, the write signal TWR to active, and also TI to 0xF, as shown at C3. In this case, the write processing is done at the lower clock frequency CF2 . The tester then sets TXSTART of FIG. 14 to 1 by setting the address signal TAD to 0xF, the write signal TWR to active, and also the signal TI to 0x1, as shown at C4. This starts the automatic transmission processing by the communications sequencer CSQ.

FIG. 18 is a waveform chart showing the portion C5 of FIG. 17 enlarged. When the transmission processing of the communications sequencer CSQ (the transmission sequencer TSQ) starts, the signal TXVALID goes active at D1 in FIG. 18 and the macro block MB2 makes the signal TXREADY go active at D2. The transmission data signal DATAIN (FF) is transmitted to MB2 at D3.

When the macro block MB2 receives the transmission data signal DATAIN, transmission processing over the USB starts, using the differential signals DP and DM, as shown at D4. The macro block MB2 that has been set to loopback mode receives the transmission data signal that it has transmitted as a reception data signal in loopback mode. The macro block MB2 makes the signal RXACTIVE go active, as shown at D5. MB2 subsequently makes the signal RXVALID go active, as shown at D6 and D7. When that happens, the communications sequencer CSQ (the reception sequencer RSQ) that has received that signal stores the reception data signal DATAOUT (FF) from MB2 in the test reception buffer RXB, as shown at D8 and D9. The storage processing in this case is done at the higher clock frequency CF1.

Subsequently, the tester causes the reception data signal TO that has been stored in the reception buffer RXB to be read by the tester through the test output terminals TPO, as shown at C7 in FIG. 17, by setting the address signal TAD to 0x0 to 0x7 and the read signal TRD to active, as shown at C6. The read-out processing in this case is done at the lower clock frequency CF3 . The tester then performs comparison processing between the read-out values and expected values, and determines a pass if they match the expected values or a failure if they do not match. This completes the testing.

8. Macro Blocks

Figure 19:
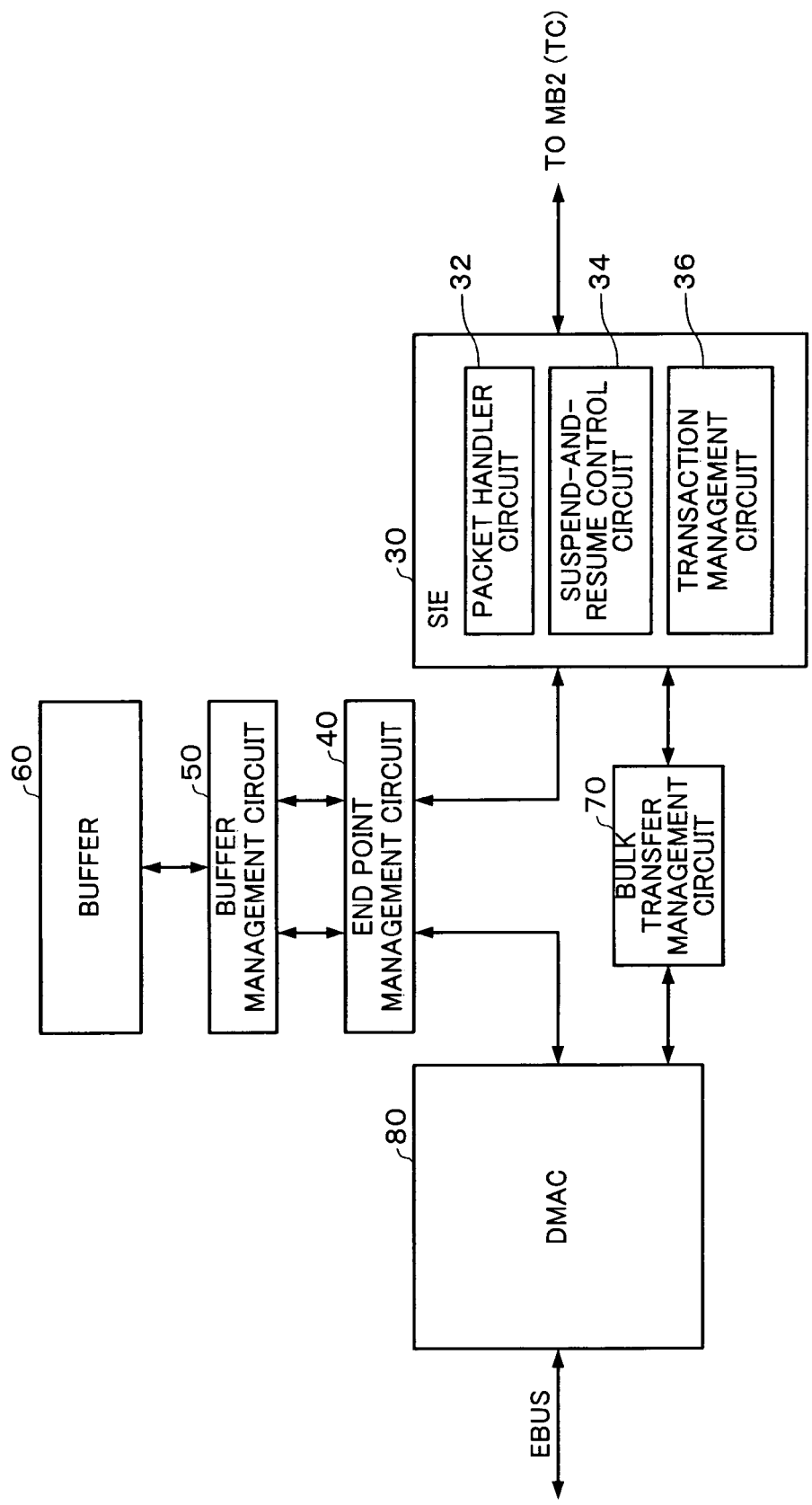
FIG. 19 shows an example of the macro block MB1.

An example of the macro block MB1 is shown in FIG. 19. Note that the macro block MB1 of this embodiment is not limited to the configuration shown in FIG. 19. The macro block MB1 of FIG. 19 comprises a serial interface engine (SIE) 30, an end point management circuit 40, a buffer management circuit 50, a buffer 60, a bulk transfer management circuit 70, and a direct memory access controller (DMAC) 80.

The SIE 30 is a circuit that performs various types of processing such as USB packet transfer processing. This SIE 30 (generally speaking: a first interface circuit) comprises a packet handler circuit 32, a suspend-and-resume control circuit 34, and a transaction management circuit 36. In this case, the packet handler circuit 32 is a circuit for assembling (generating) or analyzing packets formed of headers and data, and it generates and analyzes CRCs. The suspend-and-resume control circuit 34 is a circuit that performs sequence control during the suspension and resumption of processing. The transaction management circuit 36 is a circuit for managing transactions made up of token, data, handshake, and other packets. When a token packet is received, the transaction management circuit 36 confirms whether or not that packet has the device's own address and, if it does have that address, it performs processing to transfer data packets, then processing for transferring a handshake packet.

The end point management circuit 40 is a circuit for managing the end points that form entrances to the various storage areas of the buffer 60, and it comprises components such as registers (a register set) for storing attribute information for those end points.

The buffer management circuit 50 is a circuit for managing the buffer 60, and is formed of components such as RAM. More specifically, it generates write addresses or read addresses and performs processing to write data to the buffer 60 or read data from the buffer 60.

The buffer 60 (packet buffer or packet storage means) is designed to store data (packets) temporarily, for transfer through USB, and it has various functions such as compensating for any speed difference between the data transfer speed of USB (the first bus) and the data transfer speed of EBUS (a second bus). Note that EBUS is an external bus that connects together devices such as hard disk drives, optical disk drives, MPEG encoders, and MPEG decoders.

The bulk transfer management circuit 70 is a circuit for managing bulk transfers under USB. The DMAC 80 (generally speaking: a second interface circuit) is a DMA controller for performing DMA transfers to and from an external device through EBUS.

Figure 20:
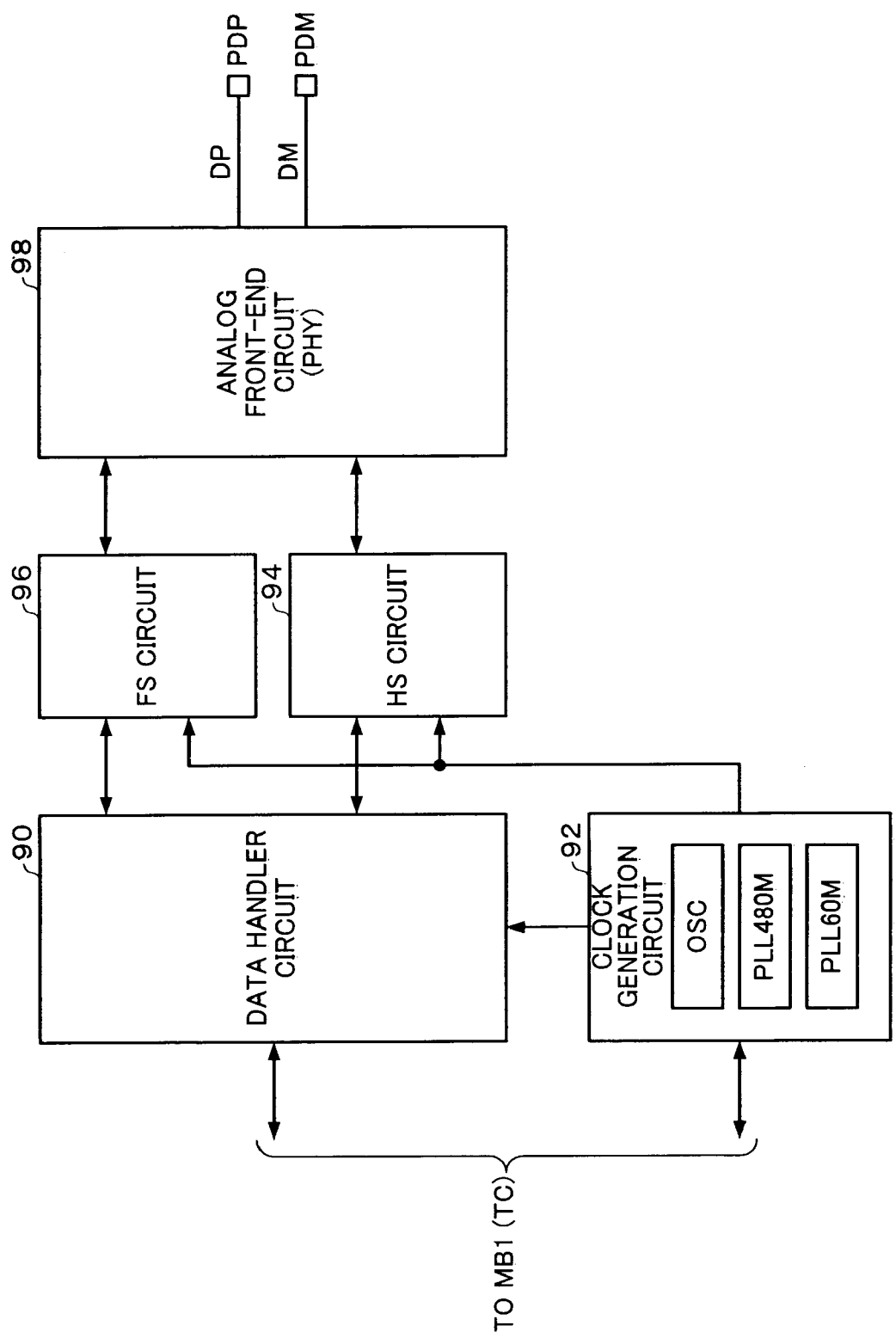
FIG. 20 shows an example of the macro block MB2.

An example of the macro block MB2 is shown in FIG. 20. Note that the macro block MB2 of this embodiment is not limited to the configuration shown in FIG. 20.

The macro block MB2 comprises a data handler circuit 90, a clock generation circuit 92, a high-speed (HS) circuit 94, and a full-speed (FS) circuit 96. These circuits are logic-level circuits. MB2 also comprises an analog front-end circuit 98 (transmission and reception circuit) that is a physical-layer circuit PHY.

The data handler circuit 90 performs various types of processing for transferring data in conformation with a standard such as USB 2.0. More specifically, during transmission, it performs processing such as attaching synchronization (SYNC), start of packet (SOP), and end of packet (EOP) codes to the data to be transmitted, and bit stuffing. During reception, on the other hand, it performs processing to detect and remove the SYNC, SOP, and EOP codes, and bit unstuffing. In addition, the data handler circuit 90 generates various timing signals for controlling the data transmission and reception.

With USB 2.0, an HS mode (generally speaking: a first transfer mode) and an FS mode (generally speaking: a second transfer mode) are defined. HS mode is a new transfer mode that has been defined by USB 2.0. FS mode is a transfer mode that was defined previously by the prior-art USB 1.1.

The clock generation circuit 92 is a circuit that generates clocks of various frequencies, such as the 480-MHz clock for HS and the 60-MHz system clock, and it comprises an oscillation circuit (OSC), a PLL 480M, and a PLL 60M.

In this case, the OSC generates a base clock in combination with other components such as an external oscillator, by way of example. The PLL 480M is a phase-locked loop (PLL) that generates the 480-MHz clock necessary for HS mode as well as the 60-MHz clock necessary for FS mode and the system clock, based on the base clock generated by the oscillation circuit (OSC). The PLL 60M is a PPL that generates the 60-MHz clock necessary for the system clock and FS mode, based on the base clock generated by the oscillation circuit (OSC).

The HS circuit 94 is a logic circuit for transmitting and receiving data in HS mode, which has a data transfer speed of 480 Mbps. The FS circuit 96 is a logic circuit for transmitting and receiving data in FS mode, which has a data transfer speed of 12 Mbps.

The analog front-end circuit 98 (transmission and reception circuit) is an analog circuit comprising drivers and receivers for transmission and reception in FS and HS modes, and it uses the differential signals DP and DM for transmission and reception processing. This analog front-end circuit 98 could comprise an HS-mode driver and receiver for transmission and reception in HS mode and an FS-mode driver and receiver for transmission and reception in FS mode.

Note that the present invention is not limited to this embodiment and thus various modifications thereto are possible within the scope of the invention laid out herein.

For example, the configurations of the test circuit and the first and second macro blocks are not limited to those described with reference to FIGS. 2, 5, 6, 11, 13, 19, and 20, and various modifications thereto are possible.

The present invention includes a configuration in which circuits equivalent to the test transmission buffer TXB, the test reception buffer RXB, the communications sequencer CSQ, the selectors SEL1 and SEL2, dummy scan flip-flop DSFF, and the test buffer TSB are used.

The transmission and reception processing performed by the second macro block over the first bus (the physical-layer circuit comprised within the second macro block) is not limited to transmission and reception processing conforming to USB 2.0 (USB 2.0 physical-layer circuit). The present invention can also be applied to transmission and reception processing that is based on another high-speed serial transfer standard, such as USB 2.0 or a standard based on a similar concept, transmission and reception processing based on a standard developed from USB 2.0, or the IEEE 1394 standard.

In addition, terminology (such as: UTMI, SIE, DMAC, HS mode, FS mode, three items, four stages, and four bytes) that is derived from generic terminology defined within this document (such as: communications macro block specification, first interface circuit, second interface circuit, first transfer mode, second transfer mode, first bus, (I-J) items, plurality of stages, and plurality of bytes) could be replaced by other terminology used within this document.

Part of requirements of a claim of the present invention could be omitted from a dependent claim which depends on that claim. Moreover, part of requirements of any independent claim of the present invention could be made to depend on any other independent claim.

The specification discloses the following matters about the configuration of the embodiments described above.

According to one embodiment of the present invention, there is provided a test circuit for a second macro block that performs transmission and reception processing to and from a first macro block at a first clock frequency, the test circuit comprising:

a test transmission buffer which stores a transmission data signal from a test input terminal at a second clock frequency that is lower than the first clock frequency; and a test reception buffer which outputs a reception data signal from the second macro block to a test output terminal at a third clock frequency that is lower than the first clock frequency, wherein, after storing the transmission data signal from the test input terminal at the second clock frequency, the test transmission buffer outputs the stored transmission data signal to the second macro block at the first clock frequency, the second macro block including a physical-layer circuit for data communications, and wherein, after storing the reception data signal from the second macro block at the first clock frequency, the test reception buffer outputs the stored reception data signal to the test output terminal at the third clock frequency.

According to this embodiment, the transmission data signal from the test input terminals is stored into the test transmission buffer at the lower second clock frequency (a second speed). After the storage, the transmission data signal of the test transmission buffer is read and output to the second macro block at the higher first clock frequency (a first speed). According to this embodiment, the reception data signal from the second macro block is stored in the test reception buffer at the higher first clock frequency. After the storage, the reception data signal of the test reception buffer is read and output to the test output terminals at the lower third clock frequency (a third speed). Note that the third clock frequency could be the same as the second clock frequency, or it could be different therefrom.

In this manner, according to this embodiment, the storage (writing) of the transmission data signal to the test transmission buffer from the test input terminals and the output (reading) of the reception data signal to the test output terminals from the test reception buffer are performed at the lower second and third clock frequencies. It is therefore possible to perform the testing with some temporal leeway, even if there should be signal delays in the test input terminals and test output terminals, making it possible to obtain stable test results.

According to this embodiment, the output from the test transmission buffer to the second macro block and the storage from the second macro block to the test reception buffer are performed at the higher first clock frequency. It is therefore possible to provide a test method that is optimized for the second macro block, even if that second macro block is performing transmission and reception processing to and from the first macro block at the higher first clock frequency.

In this configuration, when the second macro block that has received the transmission data signal performs transmission and reception processing in a loopback mode over a first bus that differs from a bus between the first and second macro blocks, and has output the reception data signal received in loopback mode to the first macro block side at the first clock frequency, the test reception buffer may store the reception data signal from the second macro block at the first clock frequency and may output the stored reception data signal to the test output terminal at the third clock frequency.

Note that the transmission and reception processing by the first bus (such as USB or IEEE 1394) of the second macro block is desirably performed in loopback mode, but it need not be performed in loopback mode.

In this configuration, the test circuit may comprise a communications sequencer for performing transmission and reception processing to and from the second macro block by a predetermined communications protocol, wherein the communications sequencer may perform processing for transmitting the transmission data signal stored in the test transmission buffer to the second macro block at the first clock frequency, and may perform processing for receiving the reception data signal from the second macro block into the test reception buffer at the first clock frequency.

This configuration makes it possible to improve the test efficiency because the transmission and reception processing to and from the second macro block is done automatically by the communications sequencer. Note that the communications sequencer could be provided with only one of the transmission processing function and the reception processing function.

In this configuration, the test circuit may further comprise:

a first selector having a first input to which an output signal from the first macro block is input and a second input to which the transmission data signal from the test transmission buffer is input; and a second selector having a first input to which an output signal from the first selector is input and a second input to which the reception data signal from the second macro block is input, wherein, during a second test mode for testing the second macro block:

the first selector may output the transmission data signal that has been input to the second input of the first selector to the second macro block; and the second selector may output the reception data signal from the second macro block that has been input to the second input of the second selector to the test reception buffer.

In this configuration, during a first test mode for testing the first macro block:

the first selector may output to the second selector the output signal from the first macro block that has been input to the first input of the first selector; and the second selector may output to the first macro block the output signal from the first selector that has been input to the first input of the second selector.

This configuration makes it possible to detect faults in the connecting portion between the first macro block and the test circuit by using the first test mode, for example. It also makes it possible to detect faults in the connecting portion between the test circuit and the second macro block by using the second test mode. This enables the detection of faults in the connecting portions between the first and second macro blocks.

Note that in an ordinary operating mode (a mode that is not the first and second test modes), the configuration could be such that the first selector outputs to the second macro block the output signal from the first macro block that has been input to a first input thereof and the second selector outputs to the first macro block an output signal from the second macro block that has been input to the second input thereof. Furthermore, inputs provided for the first and second selectors are not limited to the first and second inputs; it is equally possible to have three or more inputs.

In this configuration, a scan path may be set for the test circuit together with the first macro block, and the first test mode may be a scan mode in which testing is performed by a scan method that uses the scan path.

In this case, the setting of the scan path means the setting of a path from one or more scan-in terminals, through a scan flip-flop (scan circuit), to one or more scan-out terminals.

In this configuration, when the number of the output signals from the first macro block to the test circuit is I and the number of input signals from the test circuit to the first macro block is J (where I>J, I and J are integers greater than or equal to two), the test circuit may comprise (I-J) dummy scan flip-flops which holds (I-J) output signals among the I output signals from the first selector, and the dummy scan flip-flops may output the held output signals through the scan path in the scan mode.

This configuration makes it possible to check efficiently for wiring defects or the like in the (I-J) output signals (Jth to Ith output signals) among the I output signals (first to Ith output signals) from the first macro block.

According to another embodiment of the present invention, there is provided an integrated circuit comprising: any one of the above test circuits; the first macro block; and the second macro block.

According to further embodiment of the present invention, there is provided a test method for testing for a second macro block which performs transmission and reception processing to and from a first macro block at a first clock frequency, using a test circuit including a test transmission buffer and a test reception buffer, the test method comprising:

storing a transmission data signal from a test input terminal into the test transmission buffer at a second clock frequency that is lower than the first clock frequency and, after the transmission data signal has been stored, outputting the stored transmission data signal to the second macro block at the first clock frequency, the second macro block including a physical-layer circuit for data communications; and storing a reception data signal from the second macro block into the test reception buffer at the first clock frequency and, after the reception data signal has been stored, outputting the stored reception data signal to the test output terminal at a third clock frequency that is lower than the first clock frequency.

In this configuration, when the second macro block that has received the transmission data signal performs transmission and reception processing in loopback mode and has output the reception data signal received in loopback mode at the first clock frequency, the output reception data signal may be stored in the test reception buffer at the first clock frequency and the stored reception data signal may be output to the test output terminal at the third clock frequency.

In this configuration, the test circuit may comprise a communications sequencer for performing transmission and reception processing to and from the second macro block by a predetermined communications protocol, the communications sequencer may be used for transmitting the transmission data signal, which has been stored in the test transmission buffer, to the second macro block at the first clock frequency, and the communications sequencer may be used for receiving the reception data signal from the second macro block into the test reception buffer at the first clock frequency.

In this configuration, the test circuit may comprise:

a first selector having a first input to which an output signal from the first macro block is input and a second input to which the transmission data signal from the test transmission buffer is input; and a second selector having a first input to which an output signal from the first selector is input and a second input to which the reception data signal from the second macro block is input, and during a second test mode for testing the second macro block:

a transmission data signal that has been input to the second input of the first selector may be output to the second macro block; and the reception data signal from the second macro block, which has been input to the second input of the second selector, may be output to the test reception buffer.

In this configuration, during a first test mode for testing the first macro block:

the output signal from the first macro block that is input to the first input of the first selector may be output to the first input of the second selector; and the output signal from the first selector that has been input to the first input of the second selector may be output to the first macro block.

In this configuration, a scan path may be set for the test circuit together with the first macro block, and testing may be performed in scan mode by a scan method that uses the scan path, in the first test mode.

In this configuration, when the number of the output signals from the first macro block to the test circuit is I and the number of input signals from the test circuit to the first macro block is J (where I>J, I and J are integers greater than or equal to two), (I-J) output signals among the I output signals from the first selector may be held in dummy scan flip-flops, and the held output signals may be output through the scan path in the scan mode.

What is claimed is:

1. A test circuit for a second macro block that performs transmission and reception processing to and from a first macro block at a first clock frequency, the test circuit comprising:

a test transmission buffer which stores a transmission data signal from a test input terminal at a second clock frequency that is lower than the first clock frequency; and a test reception buffer which outputs a reception data signal from the second macro block to a test output terminal at a third clock frequency that is lower than the first clock frequency, wherein, after storing the transmission data signal from the test input terminal at the second clock frequency, the test transmission buffer outputs the stored transmission data signal to the second macro block at the first clock frequency, the second macro block including a physical-layer circuit for data communications, and wherein, after storing the reception data signal from the second macro block at the first clock frequency, the test reception buffer outputs the stored reception data signal to the test output terminal at the third clock frequency.

2. The test circuit as defined in claim 1, wherein, when the second macro block that has received the transmission data signal performs transmission and reception processing in a loopback mode over a first bus that differs from a bus between the first and second macro blocks, and has output the reception data signal received in loopback mode to the first macro block side at the first clock frequency, the test reception buffer stores the reception data signal from the second macro block at the first clock frequency and outputs the stored reception data signal to the test output terminal at the third clock frequency.

3. The test circuit as defined in claim 1, further comprising:

a communications sequencer for performing transmission and reception processing to and from the second macro block by a predetermined communications protocol, wherein the communications sequencer performs processing for transmitting the transmission data signal stored in the test transmission buffer to the second macro block at the first clock frequency, and performs processing for receiving the reception data signal from the second macro block into the test reception buffer at the first clock frequency.

4. An integrated circuit comprising a test circuit for a second macro block that performs transmission and reception processing to and from a first macro block at a first clock frequency, the test circuit comprising:

a first macro block;

a second macro block;

a test transmission buffer which stores a transmission data signal from a test input terminal at a third clock frequency that is lower than the first clock frequency;

a test reception buffer which outputs a reception data signal from the second macro block to a test output terminal at a third clock frequency that is lower than the first clock frequency;

wherein, after storing the transmission data signal from the test input terminal at the second clock frequency, the test transmission buffer outputs the stored transmission data signal to the second macro block at the first clock frequency, the second macro block including a physical-layer circuit for data communications, and wherein, after storing the reception data signal from the second macro block at the first clock frequency, the test reception buffer outputs the stored reception data signal to the test output terminal at the third clock frequency.

5. An integrated circuit comprising:

the test circuit as defined in claim 4;

wherein, when the second macro block that has received the transmission data signal performs transmission and reception processing in a loopback mode over a first bus that differs from a bus between the first and second macro blocks, and has output the reception data signal received in loopback mode to the first macro block side at the first clock frequency, the test reception buffer stores the reception data signal from the second macro block at the first clock frequency and outputs the stored reception data signal to the test output terminal at the third clock frequency.

6. An integrated circuit comprising:

the test circuit as defined in claim 4;

a communications sequencer for performing transmission and reception processing to and from the second macro block by a predetermined communications protocol, wherein the communications sequencer performs processing for transmitting the transmission data signal stored in the test transmission buffer to the second macro block at the first clock frequency, and performs processing for receiving the reception data signal from the second macro block into the test reception buffer at the first clock frequency;

the first macro block; and the second macro block.

7. A test method for testing for a second macro block which performs transmission and reception processing to and from a first macro block at a first clock frequency, using a test circuit including a test transmission buffer and a test reception buffer, the test method comprising:

storing a transmission data signal from a test input terminal into the test transmission buffer at a second clock frequency that is lower than the first clock frequency and, after the transmission data signal has been stored, outputting the stored transmission data signal to the second macro block at the first clock frequency, the second macro block including a physical-layer circuit for data communications; and storing a reception data signal from the second macro block into the test reception buffer at the first clock frequency and, after the reception data signal has been stored, outputting the stored reception data signal to the test output terminal at a third clock frequency that is lower than the first clock frequency.

8. The test method as defined in claim 7, wherein, when the second macro block that has received the transmission data signal performs transmission and reception processing in loopback mode and has output the reception data signal received in loopback mode at the first clock frequency, the output reception data signal is stored in the test reception buffer at the first clock frequency and the stored reception data signal is output to the test output terminal at the third clock frequency.

9. The test method as defined in claim 7, wherein the test circuit comprises a communications sequencer for performing transmission and reception processing to and from the second macro block by a predetermined communications protocol, wherein the communications sequencer is used for transmitting the transmission data signal, which has been stored in the test transmission buffer, to the second macro block at the first clock frequency, and wherein the communications sequencer is used for receiving the reception data signal from the second macro block into the test reception buffer at the first clock frequency.

* * * * *